(12) United States Patent
Taniguchi et al.

(10) Patent No.: US 10,389,964 B2
(45) Date of Patent: Aug. 20, 2019

(54) SOLID STATE IMAGING DEVICE, CONTROL METHOD OF SOLID STATE IMAGING DEVICE, IMAGING SYSTEM, AND MOBILE APPARATUS

(71) Applicant: CANON KABUSHIKI KAISHA, Tokyo (JP)

(72) Inventors: Hiroaki Taniguchi, Kawasaki (JP); Noriyuki Shikina, Hachioji (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 25 days.

(21) Appl. No.: 15/896,994

(22) Filed: Feb. 14, 2018

(65) Prior Publication Data
US 2018/0241959 A1    Aug. 23, 2018

(30) Foreign Application Priority Data
Feb. 22, 2017  (JP) ................. 2017-031170

(51) Int. Cl.
| | | |
|---|---|---|
| H04N 5/378 | (2011.01) | |
| H04N 5/3745 | (2011.01) | |
| H01L 27/148 | (2006.01) | |
| H04N 5/225 | (2006.01) | |
| H04N 5/347 | (2011.01) | |
| H04N 5/376 | (2011.01) | |
| H04N 5/353 | (2011.01) | |
| H04N 5/374 | (2011.01) | |
| H01L 27/146 | (2006.01) | |

(52) U.S. Cl.
CPC ....... *H04N 5/378* (2013.01); *H01L 27/14831* (2013.01); *H04N 5/2253* (2013.01); *H04N 5/347* (2013.01); *H04N 5/3532* (2013.01); *H04N 5/374* (2013.01); *H04N 5/376* (2013.01); *H04N 5/3765* (2013.01); *H04N 5/37452* (2013.01); *H01L 27/14609* (2013.01)

(58) Field of Classification Search
None
See application file for complete search history.

(56) References Cited

U.S. PATENT DOCUMENTS 9,860,460 B2 *    1/2018  Kim ................... H04N 5/3532
2010/0302421 A1 * 12/2010  Nakano ................. H04N 5/335
                                                                348/296

(Continued)

FOREIGN PATENT DOCUMENTS

JP         2007-104728 A       4/2007

*Primary Examiner* — Cynthia Segura
(74) *Attorney, Agent, or Firm* — Venable LLP

(57) ABSTRACT

Provided is a solid state imaging device including: a pixel unit; row drive circuits respectively corresponding to rows of the pixel unit, each including a first and a second signal generation units; drive signal generation unit configured to generate a readout scan signal and a shutter scan signal, as drive signals for driving pixels, based on signals output from the first and the second signal generation units; and a switching unit configured to switch the row drive circuit between: a first state in which the first signal generation unit generates the readout scan signal and the second signal generation unit generates the shutter scan signal and a second state in which the first signal generation unit generates the shutter scan signal and the second signal generation unit generates the readout scan signal.

14 Claims, 14 Drawing Sheets

(56) References Cited

U.S. PATENT DOCUMENTS

| | | | |
|---|---|---|---|
| 2010/0328507 A1* | 12/2010 | Kikutsugi | H04N 5/3532 348/296 |
| 2011/0102623 A1* | 5/2011 | Ebihara | H04N 5/343 348/222.1 |
| 2012/0008027 A1* | 1/2012 | Makino | H04N 5/347 348/296 |
| 2013/0308044 A1* | 11/2013 | Mitsunaga | H04N 5/3532 348/362 |
| 2015/0124133 A1* | 5/2015 | Kawazu | H04N 5/378 348/296 |
| 2016/0073016 A1 | 3/2016 | Ohya et al. | |
| 2018/0007287 A1* | 1/2018 | Takenaka | H04N 5/30 |

* cited by examiner

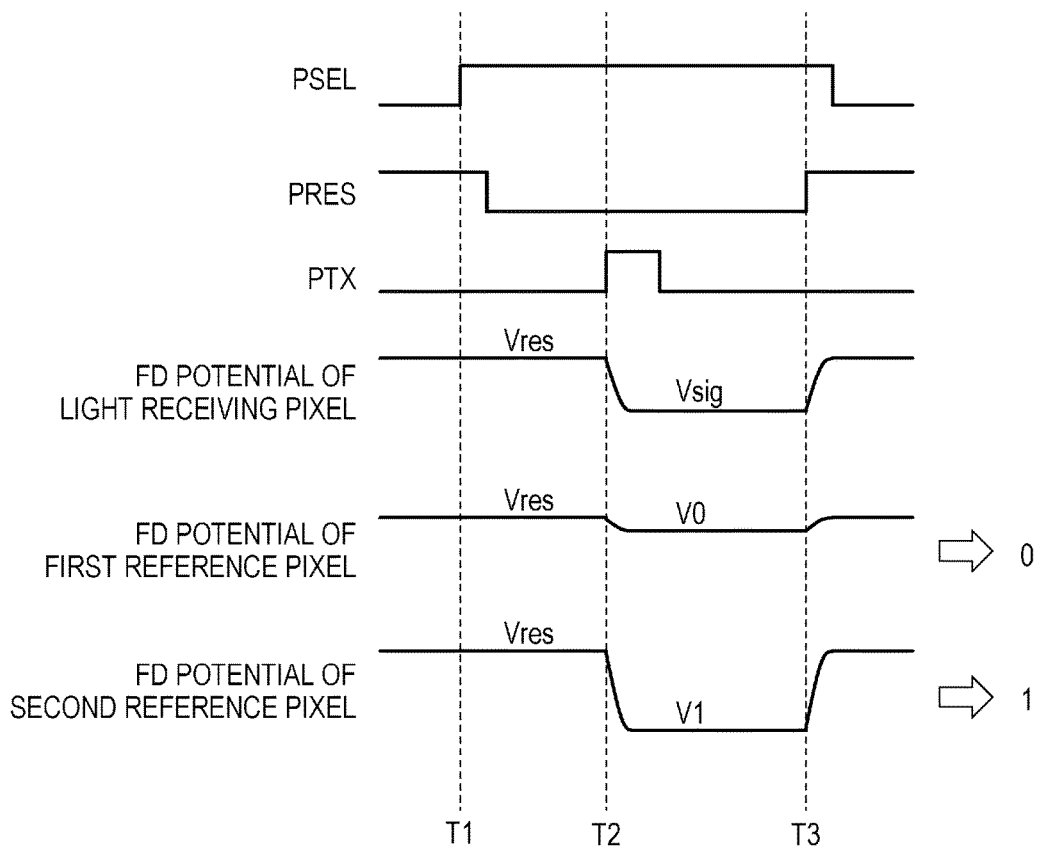

SOLID STATE IMAGING DEVICE, CONTROL METHOD OF SOLID STATE IMAGING DEVICE, IMAGING SYSTEM, AND MOBILE APPARATUS

BACKGROUND OF THE INVENTION

Field of the Invention

The present invention relates to a solid state imaging device, a control method of the solid state imaging device, an imaging system, and a mobile apparatus.

Description of the Related Art

Some imaging systems employ a CMOS image sensor that is a solid state imaging device of an XY address type. Enhancement of functionality of imaging systems has led to complex scanning in a solid state imaging device. A solid state imaging device disclosed in Japanese Patent Application Laid-Open No. 2007-104728 has a shift resistor used for readout and a shift resistor used for electronic shutter as a scanning circuit.

As disclosed in Japanese Patent Application Laid-Open No. 2007-104728, an increased number of components of a scanning circuit may result in a higher failure rate of the scanning circuit. Thus, there is a demand for a solid state imaging device which can output a signal used for detecting a failure of a scanning circuit.

SUMMARY OF THE INVENTION

A solid state imaging device of some embodiments of the present invention includes: a pixel unit including a plurality of pixels arranged to form a plurality of rows, each of the plurality of pixels including a photoelectric conversion element; a plurality of row drive circuits respectively corresponding to the plurality of rows of the pixel unit, each including a first signal generation unit, a second signal generation unit, and a drive signal generation unit configured to generate a readout scan signal for reading out a signal from the pixels and a shutter scan signal for causing the photoelectric conversion element to start charge accumulation, as drive signals for driving the plurality of pixels, based on a signal output from the first signal generation unit and a signal output from corresponding one of the second signal generation unit; and a switching unit configured to switch the row drive circuit between: a first state in which the first signal generation unit generates the readout scan signal and the second signal generation unit generates the shutter scan signal and a second state in which the first signal generation unit generates the shutter scan signal and the second signal generation unit generates the readout scan signal.

A control method of a solid state imaging device of some embodiments of the present invention including a pixel unit including a plurality of pixels arranged to form a plurality of rows, each of the plurality of pixels including a photoelectric conversion element, and a plurality of row drive circuits respectively corresponding to the plurality of rows of the pixel unit, each including a first signal generation unit, a second signal generation unit, and a drive signal generation unit configured to generate a readout scan signal for reading out a signal from the pixels and a shutter scan signal for causing the photoelectric conversion element to start charge accumulation, as drive signals for driving the plurality of pixels, based on a signal output from the first signal generation unit and a signal output from corresponding one of the second signal generation unit, the control method including steps of: generating the readout scan signal at the first signal generation unit and generating the shutter scan signal at the second signal generation unit; and generating the shutter scan signal at the first signal generation unit and generating the readout scan signal at the second signal generation unit.

Further features of the present invention will become apparent from the following description of exemplary embodiments with reference to the attached drawings.

BRIEF DESCRIPTION OF THE DRAWINGS

FIG. 8 is a timing chart schematically illustrating the operation of a pixel according to the third embodiment.

DESCRIPTION OF THE EMBODIMENTS

Preferred embodiments of the present invention will now be described in detail in accordance with the accompanying drawings.

First Embodiment

Figure 1:
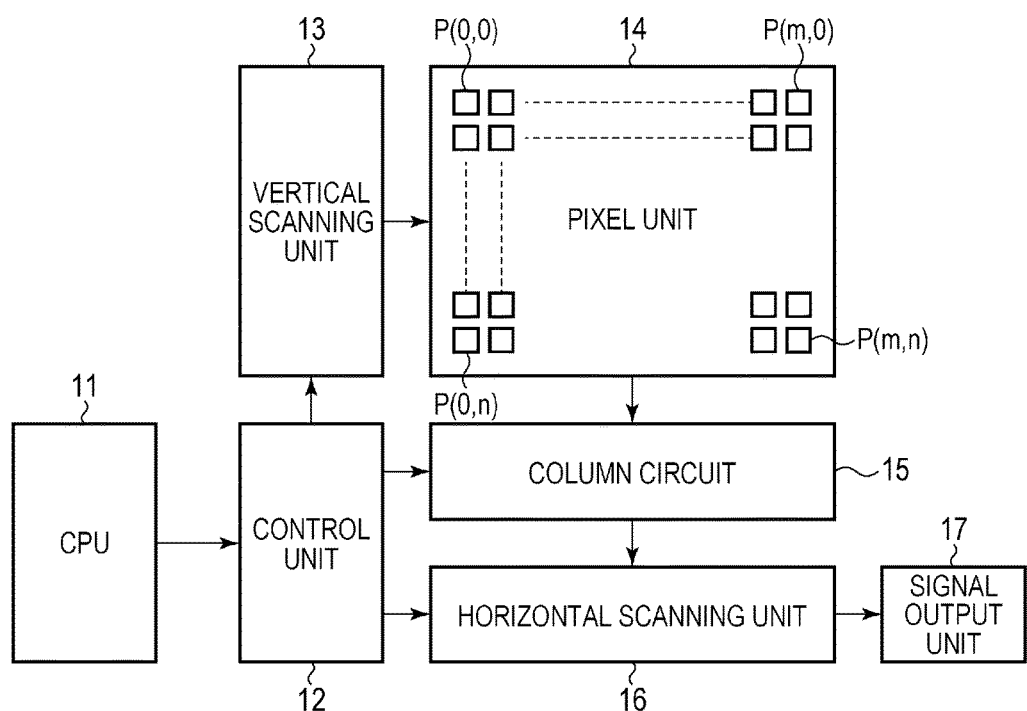
FIG. 1 is a block diagram of a solid state imaging device according to a first embodiment.

FIG. 1 is a block diagram illustrating an example configuration of a solid state imaging device according to a first embodiment. The solid state imaging device according to the present embodiment has a CPU 11, a control unit 12, a vertical scanning unit 13, a pixel unit 14, a column circuit 15, a horizontal scanning unit 16, and a signal output unit 17. The CPU 11 has a processing unit that controls the entire solid state imaging device. The control unit 12 operates in response to control signals such as a synchronization signal from the CPU 11. The pixel unit 14 has a plurality of pixels P (0, 0) to P (m, n) of (n+1) rows by (m+1) columns arranged to form a plurality of rows and a plurality of columns. Here, the row direction refers to the horizontal direction in the drawings, and the column direction refers to the vertical direction in the drawings. Further, indexes within the parenthesis of the pixel P (m, n) indicates the column number and the row number in this order. Further, the row number of the initial row is zero, and the column number of the initial column is zero. When a plurality of pixels are collectively referred to, indication of the index may be omitted. Note that the CPU 11 may be provided within an imaging system on which the solid state imaging device is mounted, that is, may be provided outside the solid state imaging device.

The vertical scanning unit 13 generates drive signals that drive the pixel unit 14 of the solid state imaging device. The vertical scanning unit 13 performs a readout scan and a shutter scan of the pixel unit 14 in response to control signals from the control unit 12. Note that a shutter scan refers to an operation of starting charge accumulation (exposure) by sequentially causing photoelectric conversion elements to be in a charge accumulation state for pixels on a part of or all of the rows in the pixel unit 14. A readout operation refers to an operation of reading out signals by sequentially outputting signals in accordance with charges accumulated in photoelectric conversion elements for pixels on a part of or all of the rows in the pixel unit 14.

The column circuit 15 has amplifier circuits, analog-to-digital converter (AD conversion) circuits, and memories. The column circuit 15 amplifies signals from the pixel unit 14, performing AD conversion thereon, and holds the signals as digital signals in the memories. The horizontal scanning unit 16 sequentially scans and outputs signals held in the memory of the column circuit 15 in response to control signals from the control unit 12. The signal output unit 17 has a digital processing unit, a parallel-to-serial converter circuit, and an output circuit such as low voltage differential signaling (LVDS). The signal output unit 17 digitally processes signals output from the horizontal scanning unit 16, and outputs the digitally processed signals as serial data to the outside of the imaging device. Note that it is not essential for the column circuit 15 to have an AD conversion function, and the configuration thereof may be modified to perform AD conversion outside the imaging device, for example. In this case, the configuration of the horizontal scanning unit 16 and the signal output unit 17 is properly modified so as to be adapted to processing of analog signals.

Figure 2:
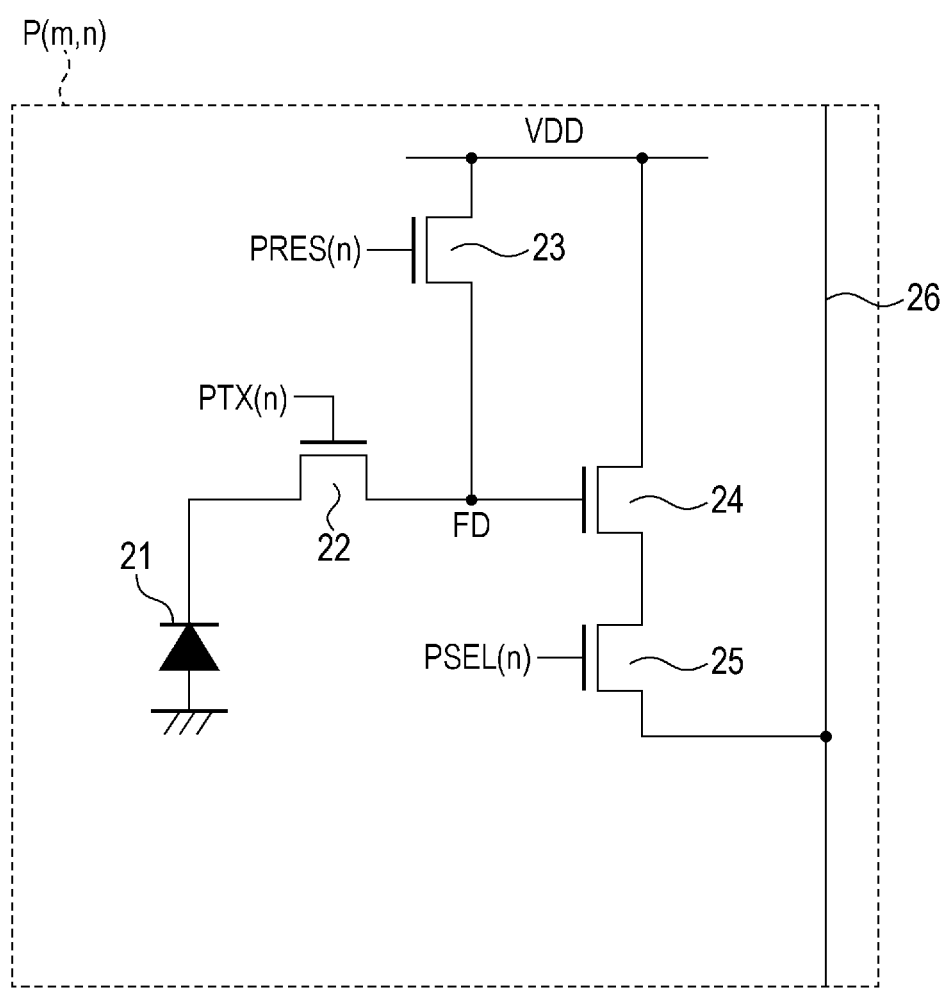
FIG. 2 is a circuit diagram of a pixel according to the first embodiment.

FIG. 2 is a circuit diagram of a pixel P according to the present embodiment. The pixel P(m, n) illustrated in FIG. 2 represents a pixel arranged at the (n+1)-th row and the (m+1)-th column of the pixel unit 14. The pixel P has a photoelectric conversion element 21, a transfer transistor 22, a floating diffusion FD, a reset transistor 23, an amplification transistor 24, a selection transistor 25, and a vertical output line 26. The photoelectric conversion element 21 is an element such as a photodiode that performs photoelectric conversion and generates charges in accordance with the incident light amount.

A transfer signal PTX(n) is a signal that controls the transfer transistor 22 on the n-th row, which is output from the vertical scanning unit 13 and input to the gate of the transfer transistor 22. A reset signal PRES(n) is a signal that controls the reset transistor 23 on the n-th row, which is output from the vertical scanning unit 13 and input to the gate of the reset transistor 23. A selection signal PSEL(n) is a signal that controls the selection transistor on the n-th row, which is output from the vertical scanning unit 13 and input to the gate of the selection transistor 25. Each transistor is in a conduction state (on-state) when a signal input to the gate thereof is at a high level, and each transistor is in a non-conduction state (off-state) when a signal input to the gate thereof is at a low level. Further, a high level corresponds to a logic value "1", and a low level corresponds to a logic value "0". Note that an index in a parenthesis of each signal indicates the row number and, when signals input to a plurality of rows are collectively referred to, the indication of the index may be omitted.

The source of the transfer transistor 22 is connected to the cathode of the photoelectric conversion element 21, and the drain of the transfer transistor 22 is connected to the floating diffusion FD. The transfer transistor 22 is controlled to be turned on or off by the transfer signal PTX(n) output from the vertical scanning unit 13. Once the transfer transistor 22 is turned on, charges generated by the photoelectric conversion element 21 are transferred to the floating diffusion FD that is the input node of the amplification transistor 24.

The source of the reset transistor 23 is connected to the floating diffusion FD, and the drain of the reset transistor 23 is connected to a power source line that supplies the power source potential VDD. The reset transistor 23 is controlled to be turned on or off by the reset signal PRES(n) output from the vertical scanning unit 13. Once the reset transistor 23 is turned on, the potential of the floating diffusion FD is reset.

The floating diffusion FD is connected to the gate of the amplification transistor 24. The drain of the amplification transistor 24 is connected to the power source line that supplies the power source potential VDD, and the source of the amplification transistor 24 is connected to the drain of the selection transistor 25.

The source of the selection transistor 25 is connected to the vertical output line 26. The selection transistor 25 is controlled to be turned on or off by the selection signal PSEL(n) output from the vertical scanning unit 13. Once the selection transistor 25 is turned on, the source of the amplification transistor 24 is connected to the vertical output line 26 and a current source (not shown), which operates as a source follower circuit. Thereby, a signal in accordance with the potential of the floating diffusion FD is output to the vertical output line 26. Note that the name of source and drain of a transistor may be different in accordance with the conductivity type of the transistor, a function in interest, or the like and may have names opposite to the source and the drain described above.

Figure 3:
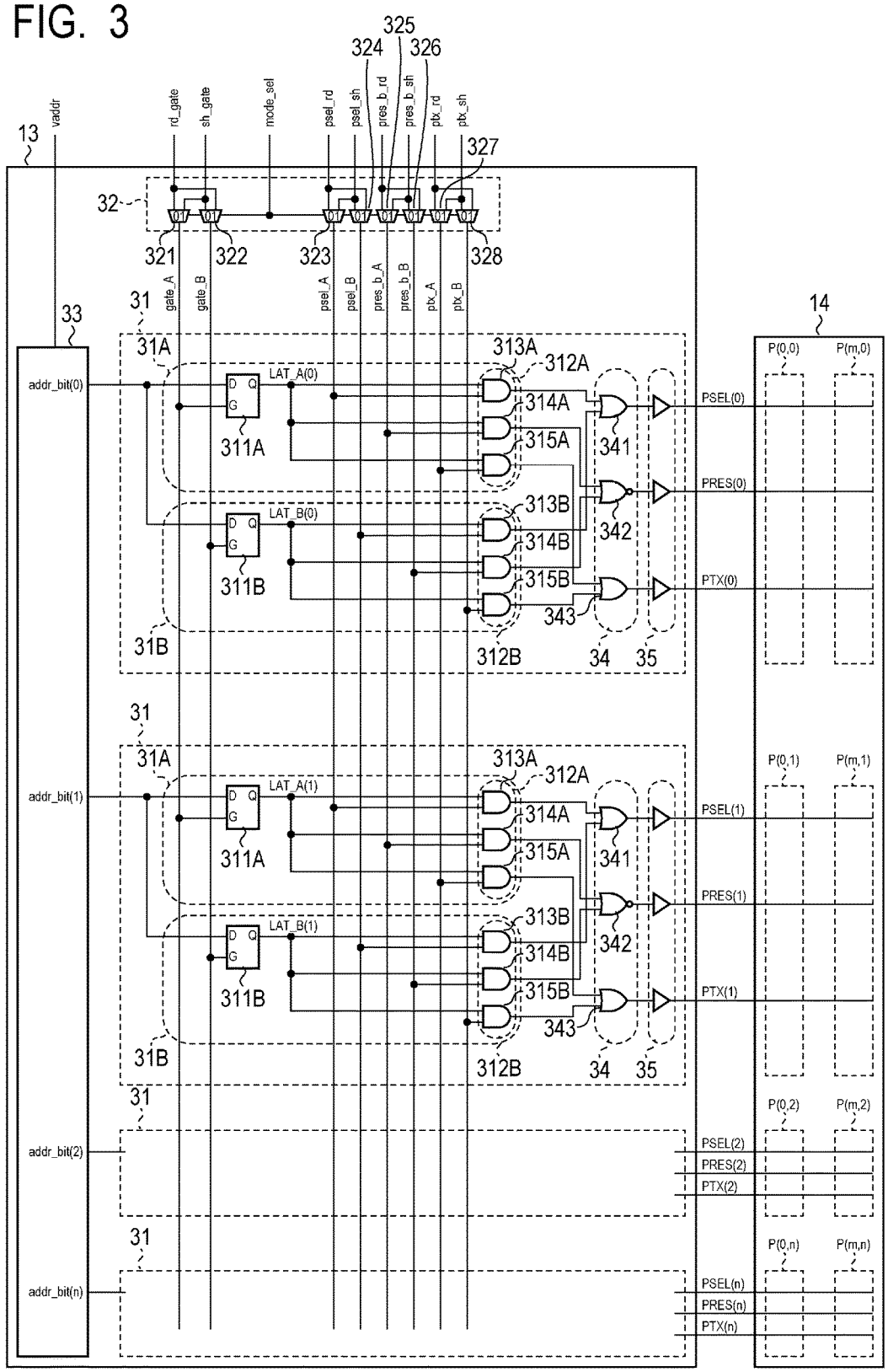
FIG. 3 is a block diagram of a vertical scanning unit and a pixel unit according to the first embodiment.

FIG. 3 is a block diagram illustrating an example configuration of the vertical scanning unit 13 and the pixel unit 14 according to the present embodiment. The vertical scanning unit 13 has row drive units 31 provided corresponding to respective rows of the pixel unit 14, a switching unit 32, and an address decoder 33. The address decoder 33 decodes an address signal vaddr generated by the control unit 12 to generate decode signals addr_bit(0) to addr_bit(n) and outputs the decode signals to the corresponding row drive units 31. The address signal vaddr is a signal that indicates the row number on which the pixel unit 14 is driven, and the decode signals addr_bit(0) to addr_bit(n) are signals that select the row drive units 31 corresponding to the rows on which the pixel unit 14 is driven. That is, the address decoder 33 has a function as a row designation unit that outputs a signal designating a row on which the pixel unit 14 is driven.

While the configuration of the row drive unit 31 on the 0-th row will mainly be described below, the row drive units 31 on other rows have the same configuration. The row drive unit 31 has a signal generation unit 31A (first signal generation unit), a signal generation unit 31B (second signal generation unit), a signal combining unit 34, and a level shift unit 35. The signal generation unit 31A has a D latch 311A and a signal combining unit 312A. The signal generation unit 31B has a D latch 311B and a signal combining unit 312B. The signal combining unit 312A has AND circuits 313A, 314A, and 315A. The signal combining unit 312B has AND circuits 313B, 314B, and 315B. The signal combining unit 34 has OR circuits 341 and 343 and a NOR circuit 342.

The switching unit 32 has a plurality of selectors 321 to 328 that switch the control lines which transmits control signals used for readout scan and control signals used for shutter scan input from the control unit 12 in accordance with a mode selection signal mode_sel. The control signals used for readout scan include control signals rd_gate, psel_rd, pres_b_rd, and ptx_rd. The control signals used for shutter scan include control signals sh_gate, psel_sh, pres_b_sh, and ptx_sh. These control signals are generated by the control unit 12.

When the mode selection signal mode_sel is at a low level, each selector of the switching unit 32 outputs a signal input to an input terminal "0" of each selector. At this time, the switching unit 32 outputs the control signal used for readout scan to the signal generation unit 31A and outputs the control signal used for shutter scan to the signal generation unit 31B. In the present embodiment, the single switching unit 32 is provided inside the vertical scanning unit 13 to perform switching control common to the row drive units 31. That is, when the mode selection signal mode_sel is at a low level, a control signal used for readout scan described above is commonly supplied to the signal generation units 31A on respective rows, and a control signal used for shutter scan described above is commonly supplied to the signal generation units 31B on respective rows.

More specifically, the selector 321 selects the control signal rd_gate and outputs it as a control signal gate_A to the gate input terminal G of the D latch 311A on each row. The selector 322 selects the control signal sh_gate and outputs it as a control signal gate_B to the gate input terminal G of the D latch 311B on each row. The selector 323 selects the control signal psel_rd and outputs it as a control signal psel_A to one of the input terminals of the AND circuit 313A on each row. The selector 324 selects the control signal psel_sh and outputs it as a control signal psel_B to one of the input terminals of the AND circuit 313B on each row. The selector 325 selects the control signal pres_b_rd and outputs it as a control signal pres_b_A to one of the input terminals of the AND circuit 314A on each row. The selector 326 selects the control signal pres_b_sh and outputs it as a control signal pres_b_B to one of the input terminals of the AND circuit 314B on each row. The selector 327 selects the control signal ptx_rd and outputs it as a control signal ptx_A to one of the input terminals of the AND circuit 315A on each row. The selector 328 selects the control signal ptx_sh and outputs it as a control signal ptx_B to one of the input terminals of the AND circuit 315B on each row.

When the mode selection signal mode_sel is at a high level, each selector of the switching unit 32 outputs a signal input to an input terminal "1" of each selector. At this time, the switching unit 32 outputs the control signal used for readout scan to the signal generation unit 31B on each row and outputs the control signal used for shutter scan to the signal generation unit 31A on each row.

More specifically, the selector 321 selects the control signal sh_gate and outputs it as a control signal gate_A to the gate input terminal G of the D latch 311A on each row. The selector 322 selects the control signal rd_gate and outputs it as a control signal gate_B to the gate input terminal G of the D latch 311B on each row. The selector 323 selects the control signal psel_sh and outputs it as a control signal psel_A to one of the input terminals of the AND circuit 313A on each row. The selector 324 selects the control signal psel_rd and outputs it as a control signal psel_B to one of the input terminals of the AND circuit 313B on each row. The selector 325 selects the control signal pres_b_sh and outputs it as a control signal pres_b_A to one of the input terminals of the AND circuit 314A on each row. The selector 326 selects the control signal pres_b_rd and outputs it as a control signal pres_b_B to one of the input terminals of the AND circuit 314B on each row. The selector 327 selects the control signal ptx_sh and outputs it as a control signal ptx_A to one of the input terminals of the AND circuit 315A on each row. The selector 328 selects the control signal ptx_rd and outputs it as a control signal ptx_B to one of the input terminals of the AND circuit 315B on each row.

The decode signal addr_bit(0) output from the address decoder 33 is input to the data input terminal D of the D latch 311A and the data input terminal D of the D latch 311B. The D latch 311A stores the input value of the data input terminal D in response to a high-level pulse of the control signal gate_A input to the gate input terminal G and outputs a control signal LAT_A(0) from the output terminal Q. The control signal LAT_A(0) is input to the other input terminals of the AND circuits 313A, 314A, and 315A. The D latch 311B stores the input value of the data input terminal D in response to a high-level pulse of the control signal gate_B input to the gate input terminal G and outputs a control signal LAT_B(0) from the output terminal Q. The control signal LAT_B(0) is input to the other input terminals of the AND circuits 313B, 314B, and 315B. In such a way, the D latches 311A and 311B each have a function as a holding unit that holds decode signals addr_bit(0) to addr_bit(n) designating a row on which a drive signal is generated. A readout scan signal or a shutter scan signal is generated in accordance with the control signal LAT_A(0) or the like output from the holding unit.

The AND circuit 313A outputs a logical product of the control signal LAT_A(0) and the control signal psel_A to the one of the input terminals of the OR circuit 341. The AND circuit 313B outputs a logical product of the control signal LAT_B(0) and the control signal psel_B to the other input terminal of the OR circuit 341. The OR circuit 341 outputs a logical sum of these input signals as the selection signal PSEL(0) via the level shift unit 35 to a control line provided corresponding to the pixels P(0, 0) to P(m, 0) on the 0-th row. Note that the level shift unit 35 is a circuit that converts the voltage level of an input signal and outputs the converted input signal.

The AND circuit 314A outputs a logical product of the control signal LAT_A(0) and the control signal pres_b_A to the one of the input terminals of the NOR circuit 342. The AND circuit 314B outputs a logical product of the control signal LAT_B(0) and the control signal pres_b_B to the other input terminal of the NOR circuit 342. The NOR circuit 342 outputs an inverted value of a logical sum of these input signals as the reset signal PRES(0) via the level shift unit 35 to a control line provided corresponding to the pixels P(0, 0) to P(m, 0) on the 0-th row.

The AND circuit 315A outputs a logical product of the control signal LAT_A(0) and the control signal ptx_A to the one of the input terminals of the OR circuit 343. The AND circuit 315B outputs a logical product of the control signal LAT_B(0) and the control signal ptx_B to the other input terminal of the OR circuit 343. The OR circuit 343 outputs a logical sum of these input signals as the transfer signal PTX(0) via the level shift unit 35 to a control line provided corresponding to the pixels P(0, 0) to P(m, 0) on the 0-th row. In such a way, the signal combining unit 34 and the level shift unit 35 have a function as a drive signal generation unit that generates a drive signal that drives a pixel based on a signal output from the signal generation unit 31A and a signal output from the signal generation unit 31B. Note that the circuit configuration of the vertical scanning unit 13 illustrated in FIG. 3 is an example, and the circuit configuration is not limited thereto.

Figure 4:
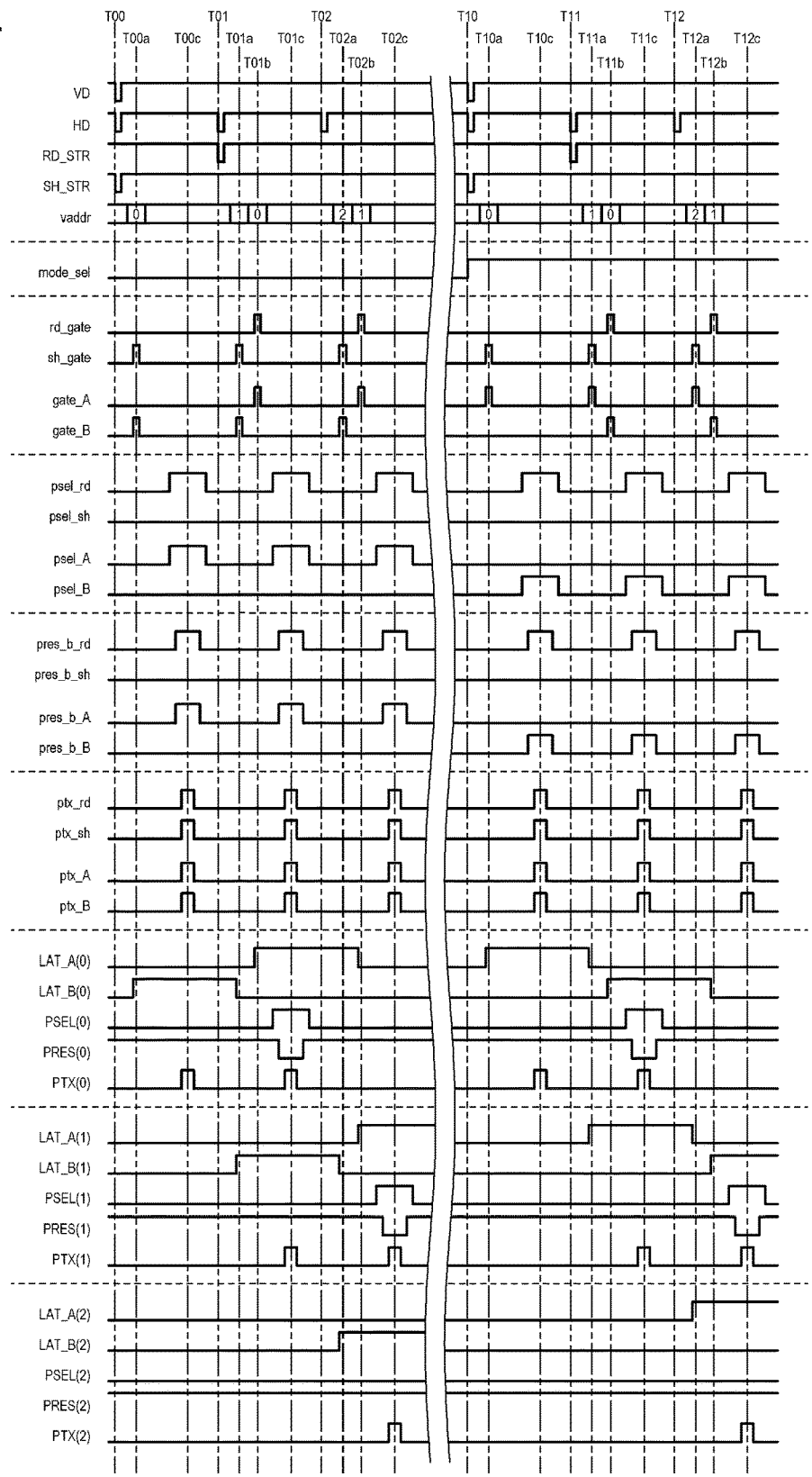
FIG. 4 is a timing chart illustrating a drive method of the vertical scanning unit according to the first embodiment.

Next, a drive method of a solid state imaging device according to the present embodiment will be described. FIG. 4 is a timing chart illustrating an example of the operation of the vertical scanning unit 13 and the pixel unit 14 according to the present embodiment. In the present drive method, the mode selection signal mode_sel is switched between a low level and a high level in an alternating manner every time a low-level pulse of the vertical synchronization signal VD that synchronizes with a frame period is input. Note that, in the following, the description of operations which do not affect signals output to the pixel unit 14 may be omitted or simplified.

At the time T00, a shutter scan of the pixel 14 is started. At the time T00, the CPU 11 inputs, to the control unit 12, the vertical synchronization signal VD and a horizontal synchronization signal HD synchronizing with readout on each row. Further, at the same time, a shutter scan start signal SH_STR is input. Note that, at the time T00, the mode selection signal mode_sel is at a low level (first state). Thus, the control signals gate_A, psel_A, pres_b_A, ptx_A, LAT_A(0) to LAT_A(n) are used as control signals for driving a readout scan. Further, the control signals gate_B, psel_B, pres_b_B, ptx_B, LAT_B(0) to LAT_B(n) are used as control signals for performing a shutter scan.

At the time T00a, since the address signal vaddr is zero, the decode signal addr_bit(0) is at a high level, and the decode signals addr_bit(1) to addr_bit(n) are at a low level. Further, before and after the time T00a, the control signal sh_gate is at a high level, and this is input as the control signal gate_B to the gate input terminal G of the D latch 311B. Thereby, the D latch 311B on the 0-th row stores a high level and maintains the control signal LAT_B(0) at a high level. This is held until the time immediately before the time T01a. Further, since the decode signals addr_bit(1) to addr_bit(n) are at a low level, the control signals LAT_B(1) to LAT_B(n) are maintained at a low level during a period from the time T00a to the time T01a. Therefore, a drive signal for driving a shutter scan is generated from only the row drive unit 31 on the 0-th row.

Before and after the time T00c, since the control signals LAT_A(0) to LAT_A(n) are at a low level and all the output signals from the signal generation unit 31A are at a low level, all the output signals from the signal generation units 31B on the first and subsequent rows are also at a low level. Thus, only the signals input to the signal generation unit 31B on the 0-th row will be described. Before and after the time T00c, the control signal ptx_sh is at a high level, and this is input as the control signal ptx_B to one of the input terminals of the AND circuit 315B. The AND circuit 315B inputs a high-level signal, which is a logical product of the control signal LAT_B(0) and the control signal ptx_B, to the OR circuit 343 (generation of a shutter scan signal by the signal generation unit 31B). Thereby, the transfer signal PTX(0) output from the OR circuit 343 via the level shift unit 35 becomes a high level. Thereby, the transfer transistor 22 on the 0-th row is temporarily turned on, and a shutter operation is performed in which the charges accumulated in the photoelectric conversion element 21 on the 0-th row are reset resulting in a charge accumulation state. Then, accumulation of charges by the photoelectric conversion element 21 on the 0-th row is started.

At the time T01, a readout scan of the pixel unit is started. The CPU 11 inputs a horizontal synchronization signal HD and a readout scan start signal RD_STR to the control unit 12.

At the time T01a, the address signal vaddr becomes "1", the decode signal addr_bit(1) is at a high level, and the decode signals addr_bit(0) and addr_bit(2) to addr_bit(n) are at a low level. Further, before and after the time T01a, the control signal sh_gate is at a high level, and this is input as the control signal gate_B to the gate input terminal G of the D latch 311B. Thereby, the D latch 311B on the first row stores a high level and maintains the control signal LAT_B(1) at a high level. This is held until the time immediately before the time T02a. Further, since the decode signals addr_bit(0) and addr_bit(2) to addr_bit(n) are at a low level, the control signals LAT_B(0) and LAT_B(2) to LAT_B(n) are maintained at a low level during a period from the time T01a to the time T02a. Therefore, a drive signal for driving a shutter scan is generated from only the row drive unit 31 on the first row.

At the time T01b, the address signal vaddr becomes "0", the decode signal addr_bit(0) is at a high level, and the decode signals addr_bit(1) to addr_bit(n) are at a low level. Further, before and after the time T01b, the control signal rd_gate is at a high level, and this is input as the control signal gate_A to the gate input terminal G of the D latch 311A. Thereby, the D latch 311A on the 0-th row stores a high level and maintains the control signal LAT_A(0) to a high level. This is held until the time immediately before the time T02b. Further, since the decode signals addr_bit(1) to addr_bit(n) are at a low level, the control signals LAT_A(1) to LAT_A(n) are maintained at a low level during a period from the time T01b to the time T02b. Therefore, a drive signal for driving a readout scan is generated from only the row drive unit 31 on the 0-th row.

Before and after the time T01c, the control signal psel_rd is at a high level, and this is input as the control signal psel_A to one of the input terminals of the AND circuit 313A on each row. The AND circuit 313A on the 0-th row inputs a high-level signal, which is a logical product of the control signal LAT_A(0) and the control signal psel_A, to the OR circuit 341 on the 0-th row (generation of a readout scan signal by the signal generation unit 31A). Thereby, the selection signal PSEL(0) output from the OR circuit 341 on the 0-th row via the level shift unit 35 becomes a high level. The selection transistors 25 on the 0-th row are turned on, and signal are read out from the pixels P(0, 0) to P(m, 0) on the 0-th row to the vertical output lines 26.

Further, before and after the time T01c, the control signal pres_b_rd is at a high level, and this is input as the control signal pres_b_A to one of the input terminals of the AND circuit 314A on each row. The AND circuit 314A on the 0-th row inputs a high-level signal, which is a logical product of the control signal LAT_A(0) and the control signal pres_b_A, to the NOR circuit 342 on the 0-th row (generation of a readout scan signal by the signal generation unit 31A). Thereby, the reset signal PRES(0) output from the NOR circuit 342 on the 0-th row via the level shift unit 35 becomes a low level. The reset transistors 23 on the 0-th row are turned off, and the reset of the pixels P(0, 0) to P(m, 0) on the 0-th row is temporarily released.

Further, before and after the time T01c, the control signal ptx_rd is at a high level, and this is input as the control signal ptx_A to one of the input terminals of the AND circuit 315A on each row. The AND circuit 315A on the 0-th row inputs a high-level signal, which is a logical product of the control signal LAT_A(0) and the control signal ptx_A, to the OR circuit 343 on the 0-th row (generation of a readout scan signal by the signal generation unit 31A). Thereby, the transfer signal PTX(0) output from the OR circuit 343 on the 0-th row via the level shift unit 35 becomes a high level. The transfer transistors 22 of the pixels P(0, 0) to P(m, 0) on the 0-th row are turned on, charges accumulated in the photoelectric conversion elements 21 are transferred to the floating diffusions FD, and signals in accordance with the accumulated charges are read out. The readout operation of the 0-th row is performed by the above operations.

Further, before and after the time T01c, the control signal ptx_sh is at a high level, and this is input as the control signal ptx_B to one of the input terminals of the AND circuit 315B on each row. The AND circuit 315B on the first row inputs a high-level signal, which is a logical product of the control signal LAT_B(1) and the control signal ptx_B, to the OR circuit 343 on the first row (generation of a shutter scan signal by the signal generation unit 31B). Thereby, the transfer signal PTX(1) output from the OR circuit 343 on the first row via the level shift unit 35 also becomes a high level, and thus the shutter operation of the first row is performed subsequently to the 0-th row.

Subsequently, the shutter scan and the readout scan of the pixel unit 14 are performed by the same operation as above while the row selected based on the address signal vaddr is sequentially shifted downward, and then signals are read out from all the rows of the pixel unit 14. In such a way, in the scan starting from the time T00, the signal generation unit 31A generates a readout scan signal for reading out signals from pixels, and the signal generation unit 31B generates a shutter scan signal for causing the photoelectric conversion elements 21 to be in a charge accumulation state.

Next, the operation of the next frame of a scan starting from the above-described time T00 will be described. At the time T10, a shutter scan of the pixel unit 14 is again started. The CPU 11 inputs the vertical synchronization signal VD and the horizontal synchronization signal HD to the control unit 12. Further, at the same time, a shutter scan start signal SH_STR is input. Further, at the time T10, the mode selection signal mode_sel transitions to a high level. Thus, the control signals gate_B, psel_B, pres_b_B, ptx_B, and LAT_B(0) to LAT_B(n) are used as control signals for performing a readout scan. Further, the control signals gate_A, psel_A, pres_b_A, ptx_A, and LAT_A(0) to LAT_A(n) are used as control signals for performing a shutter scan.

In the scan starting from the time T10, the operations of the input signals, except the mode selection signal mode_sel, to the vertical scanning unit 13 and the input signals from the vertical scanning unit 13 are the same as those in the scan starting from the time T00. The only difference is in that the functions of the signal generation unit 31A and the signal generation unit 31B are opposite to the above. In other words, in the scan starting from the time T10, the signal generation unit 31A generates a shutter scan signal for causing the photoelectric conversion elements 21 to be in a charge accumulation state, and the signal generation unit 31B generates a readout scan signal for reading out signals from pixels. Since other features are the same, the description thereof will be omitted.

In the present embodiment, in a solid state imaging device including a scan circuit having a circuit that performs a readout scan (readout scan circuit) and a circuit that performs a shutter scan (shutter scan circuit), failure detection is possible for both the readout scan circuit and the shutter scan circuit. In order to make the effect and advantage thereof clear, first, failure detection will be described.

Failure detection is performed by using an approach such as comparing a signal output from a predetermined pixel used for detection with a signal expected as an output of the pixel used for detection and determining whether or not the difference thereof is within a predetermined range. As an example of the pixel used for detection, a light-shield pixel in which the photoelectric conversion element 21 is shielded from a light may be used. This is because it is expected that, since the output from the light-shield pixel is not affected by an incident light, a signal corresponding to a black level is output. A case where the light-shield pixel is used as the pixel used for detection will be described here as an example.

In a normal operation where there is no failure in the readout scan circuit or the shutter scan circuit, the light-shield pixel outputs a small value corresponding to the black level. When there is a failure in the readout scan circuit, since readout is not normally performed, a signal level that is different from the expected black level is detected as an output of the light-shield pixel. Therefore, a use of a signal read out from the light-shield pixel enables failure detection of the readout scan circuit. On the other hand, when there is a failure in the shutter scan circuit, this approach may not be useful in failure detection. This is because the change in the signal output from the light-shield pixel is small whether a shutter scan is performed or not, and if no shutter scan is performed, a change in the level of the output signal may not be detected. In this way, in the scan circuit having the readout scan circuit and the shutter scan circuit, failure detection of the shutter scan circuit may not be made.

In contrast, in the vertical scanning unit 13 of the present embodiment, in a scan starting from the time T00, a first state is applied in which the signal generation unit 31A outputs a signal for a readout scan and the signal generation unit 31B outputs a signal for a shutter scan. In a scan starting from the time T10, a second state is applied in which the signal generation unit 31A outputs a signal for a shutter scan and the signal generation unit 31B generates a signal for a readout scan. The switching unit 32 performs switching between the first state and the second state based on the mode selection signal mode_sel. Therefore, when there is a failure in one of the signal generation units, the failure may not be detected when the failed signal generation unit outputs a signal for a shutter scan. In another frame after the state is switched, however, the failed signal generation unit will output a signal for a readout scan and thus the failure can be detected.

In specifically describing the above by using a timing chart of FIG. 4, since the signal generation unit 31A outputs a signal for a readout scan from the time T00 to the time T10, a failure of the signal generation unit 31A can be detected. Further, since the signal generation unit 31B outputs a signal for a readout scan after the time T10, a failure of the signal generation unit 31B can be detected.

When there is a failure in the signal generation unit 31A, since the readout scan is not correctly performed during the period between the time T01b to the time T02b, the signal output from the pixel used for detection has an abnormal value and thus the failure is detected. When there is a failure in the signal generation unit 31B, since the readout scan is not correctly performed during the period between the time T11b to the time T12b, the signal output from the pixel used for detection has an abnormal value and thus the failure is detected. In this way, in the vertical scanning unit 13 of the present embodiment, failure detection can be made even when there is a failure in any of the signal generation unit 31A and the signal generation unit 31B. Therefore, according to the present embodiment, a solid state imaging device that enables failure detection for both a circuit that controls a readout scan and a circuit that controls an electronic shutter scan is provided.

Further, as illustrated in FIG. 4, with the switching between the first state and the second state being at the timing of switching frames, switching of the state is performed once per frame and thus is relatively less frequent. Therefore, in the present embodiment, the power consumption due to the switching can be reduced to a relatively low level.

Second Embodiment

Figure 5:
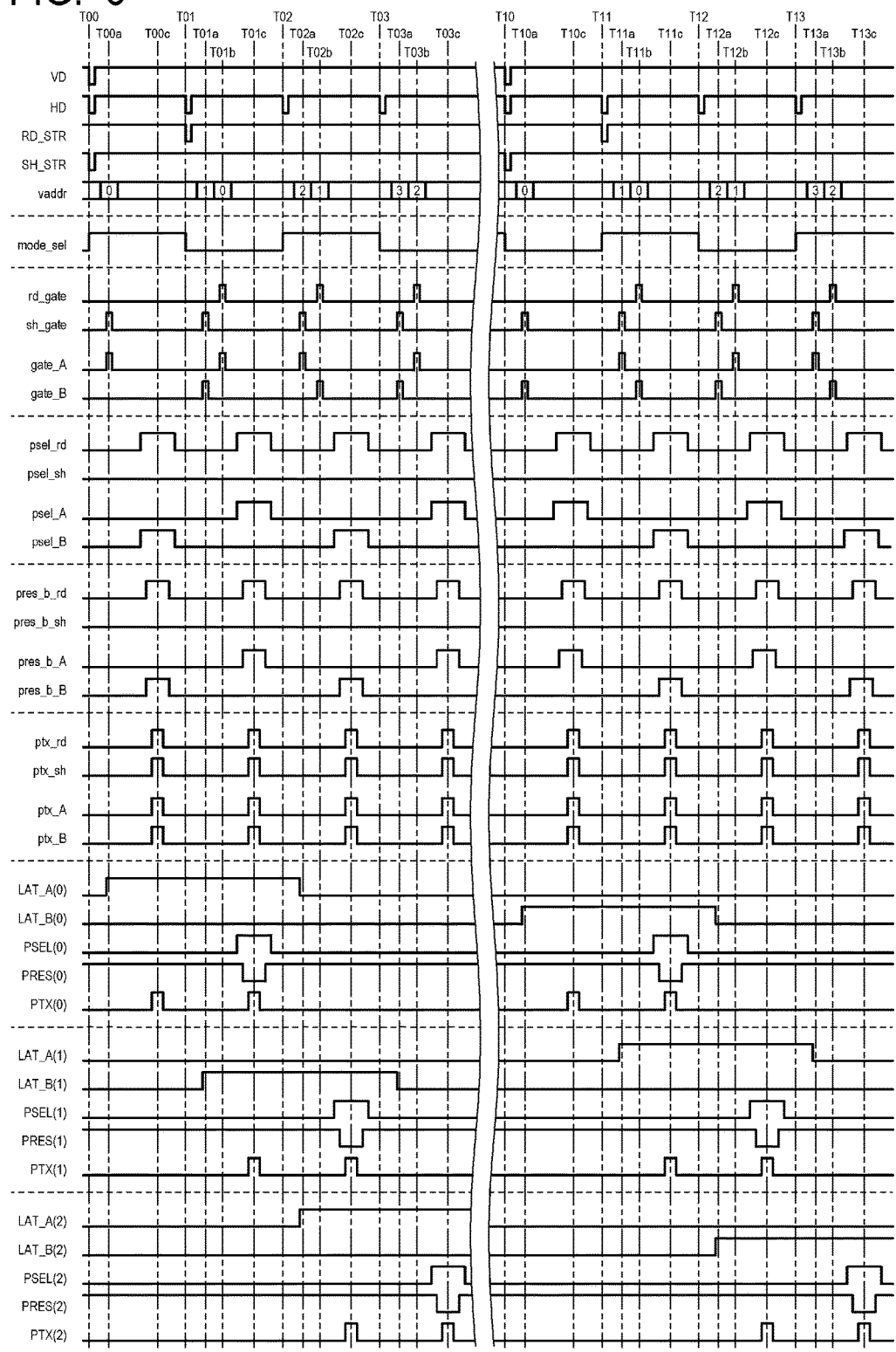
FIG. 5 is a timing chart illustrating a drive method of a vertical scanning unit according to a second embodiment.

FIG. 5 is a timing chart illustrating an example of the operation of the vertical scanning unit 13 and the pixel unit 14 according to the present embodiment. The circuit configuration of a solid state imaging device of the present embodiment is the same as that in the first embodiment. Thus, the description of common features of the circuit configuration or the like of the solid state imaging device will be omitted, and only the differences in the drive method of the solid state imaging device will be described.

In the drive method of the present embodiment is different from that of the first embodiment in that the mode selection signal mode_sel is switched between a low level and a high level in an alternating manner every time a low-level pulse of the horizontal synchronization signal HD is input.

At the time T00, a low-level pulse of the horizontal synchronization signal HD is input. Further, at the time T00, the mode selection signal mode_sel transitions to a high level. Thus, the control signals gate_A, psel_A, pres_b_A, ptx_A, and LAT_A(0) to LAT_A(n) are used as control signals for performing a shutter scan. Further, the control signals gate_B, psel_B, pres_b_B, ptx_B, and LAT_B(0) to LAT_B(n) are used as control signals for performing a readout scan. That is, during a period from the time T00 to the time T01, the signal generation unit 31A generates a shutter scan signal for causing the photoelectric conversion elements 21 to be in a charge accumulation state, and the signal generation unit 31B generates a readout scan signal for reading out signals from pixels.

At the time T01, a low-level pulse of the horizontal synchronization signal HD is input. Further, at the time T01, the mode selection signal mode_sel transitions to a low level. Thus, the control signals gate_A, psel_A, pres_b_A, ptx_A, and LAT_A(0) to LAT_A(n) are used as control signals for performing a readout scan. Further, the control signals gate_B, psel_B, pres_b_B, ptx_B, and LAT_B(0) to LAT_B(n) are used as control signals for performing a shutter scan. That is, during a period from the time T01 to the time T02, the signal generation unit 31A generates a readout scan signal for reading out signals from pixels, and the signal generation unit 31B generates a shutter scan signal for causing the photoelectric conversion elements 21 to be in a charge accumulation state. Subsequently, the operation is repeated in which the mode selection signal mode_sel is switched between a low level and a high level in an alternating manner every time a low-level pulse of the horizontal synchronization signal HD is input.

Also in the present embodiment, it is possible to perform failure detection for both the signal generation unit 31A and the signal generation 31B in a similar manner to the first embodiment. For example, when there is a failure in the signal generation unit 31A, since the readout scan is not correctly performed during a period between the time T01$b$ to the time T02$b$, the signal output from the pixel used for detection has an abnormal value and thus the failure is detected. When there is a failure in the signal generation unit 31B, since the readout scan is not correctly performed during the period between the time T02$b$ to the time T03$b$, the signal output from the pixel used for detection has an abnormal value and thus the failure is detected. Therefore, also in the present embodiment in a similar manner to the first embodiment, a solid state imaging device that enables failure detection for both a circuit that controls a readout scan and a circuit that controls an electronic shutter scan is provided.

Further, in the present embodiment, since switching between the first state and the second state is performed every time a low-level pulse of the horizontal synchronization signal HD is input, variation of the image quality within one frame is reduced.

Third Embodiment

Figure 6:
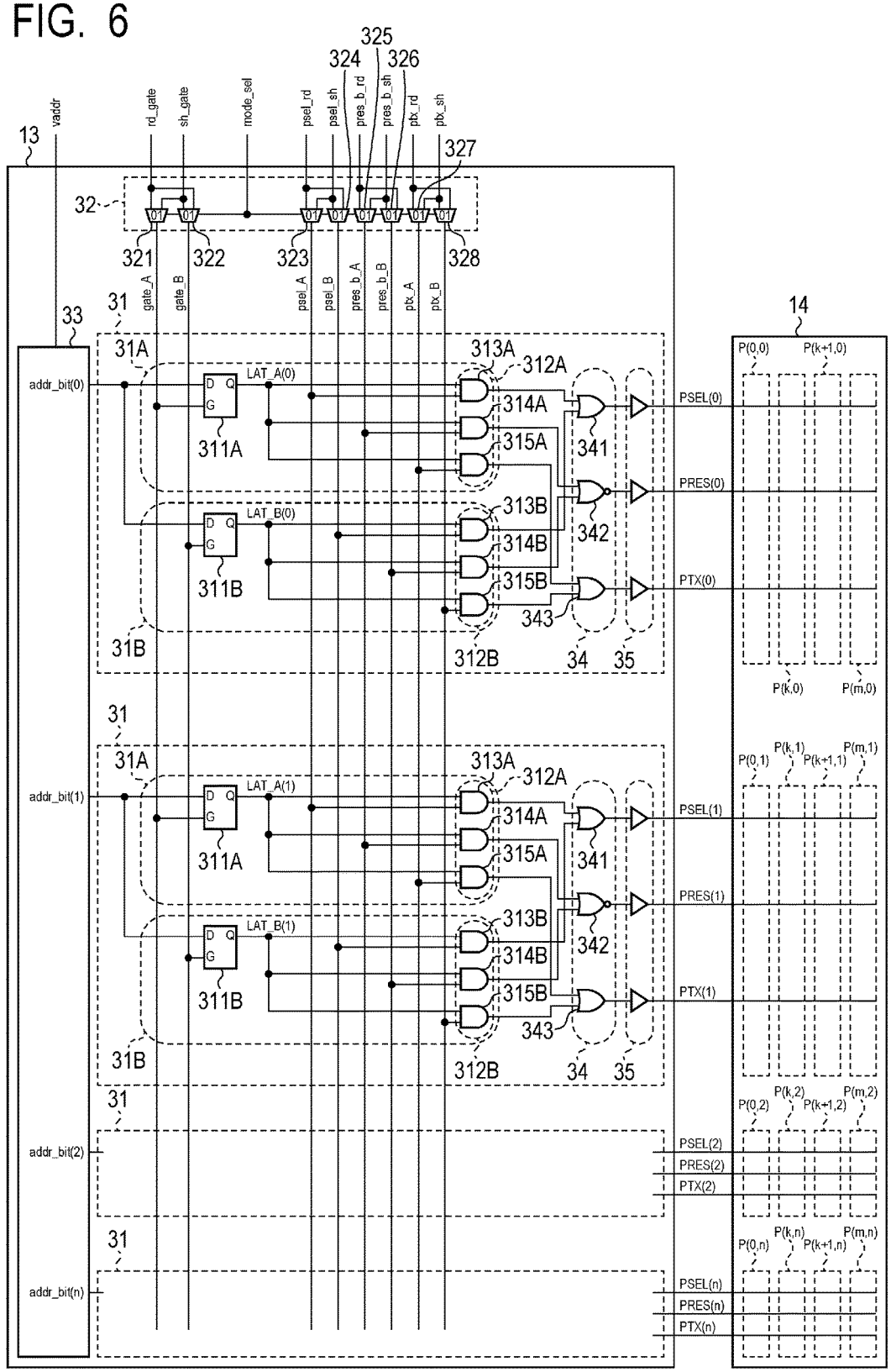
FIG. 6 is a block diagram of a vertical scanning unit and a pixel unit according to a third embodiment.

FIG. 6 is a block diagram illustrating an example configuration of the vertical scanning unit 13 and the pixel unit 14 according to the present embodiment. As illustrated in FIG. 6, since the configuration of the vertical scanning unit 13 of the present embodiment is the same as that in the first embodiment and the second embodiment, the description thereof will be omitted. Further, since the features except the vertical scanning unit 13 and the pixel unit 14 are the same as those of the first embodiment, the description thereof will be omitted.

The pixel unit 14 includes two types of pixels, namely, light receiving pixels and reference pixels. The light receiving pixels P(0, 0) to P(k, n) (k is an integer greater than zero and less than m) are arranged from the 0-th column to the k-th column of the pixel unit 14. The reference pixels P(k+1, 0) to P(m, n) are arranged from the (k+1)-th column to the m-th column of the pixel unit 14. Since the configuration of the light receiving pixels P(0, 0) to P(k, n) is the same as that of FIG. 2, the description thereof will be omitted.

Figure 7A:
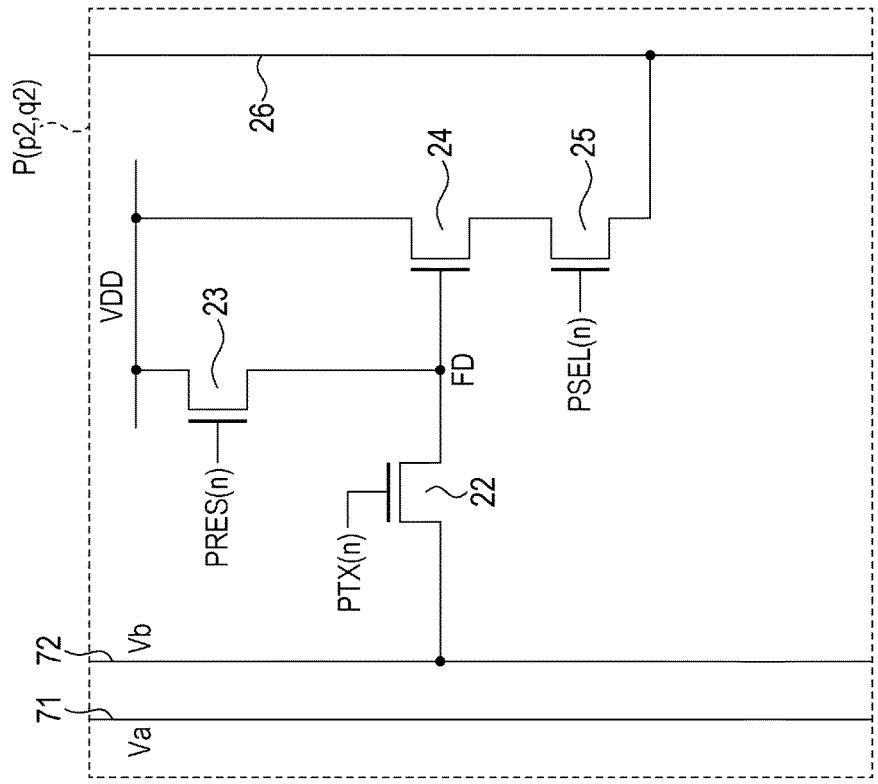
FIG. 7A and FIG. 7B are circuit diagrams of a reference pixel according to the third embodiment.
Figure 7B:
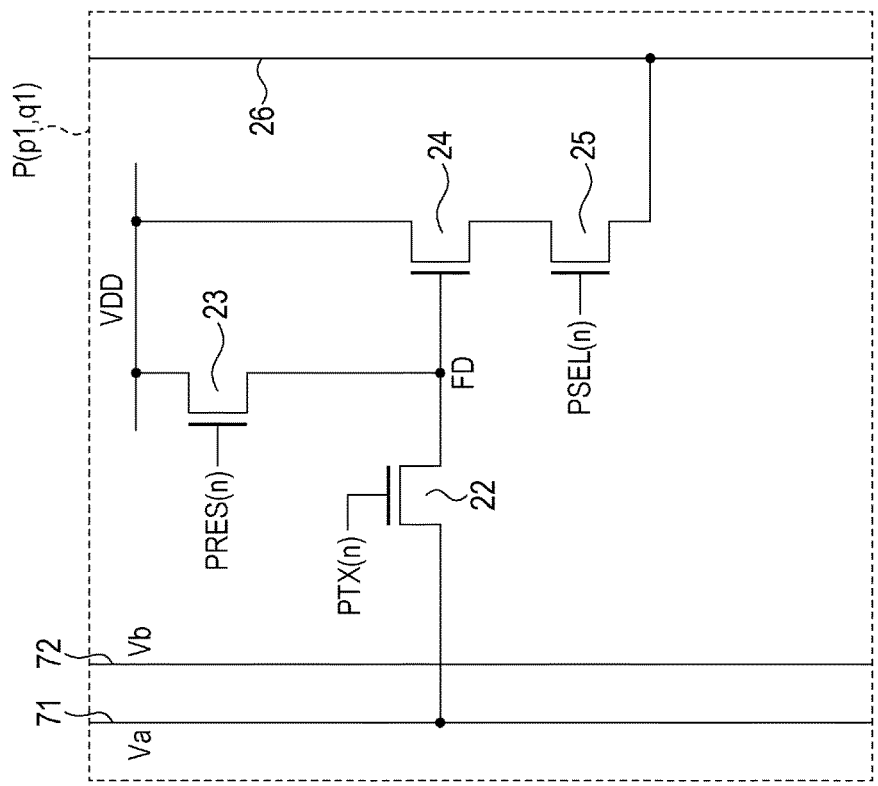

FIG. 7A and FIG. 7B are circuit diagrams of the reference pixels P(k+1, 0) to P(m, n) according to the present embodiment.

Each of the reference pixels P(k+1, 0) to P(m, n) does not include the photoelectric conversion element 21, instead, the source of the transfer transistor 22 is connected to either one of a reference potential line 71 and a reference potential line 72. The reference potential line 71 is a wiring that supplies a reference potential Va, the reference potential line 72 is a wiring that supplies a reference potential Vb. Each of the reference pixels P(k+1, 0) to P(m, n) is either a first reference pixel P(p1, q1) illustrated in FIG. 7A or a second reference pixel P(p2, q2) illustrated in FIG. 7B. In the first reference pixel illustrated in FIG. 7A, the source of the transfer transistor 22 is connected to the reference potential line 71, and the reference potential Va is supplied to the source of the transfer transistor 22. In the second reference pixel illustrated in FIG. 7B, the source of the transfer transistor 22 is connected to the reference potential line 72, and the reference potential Vb is supplied to the source of the transfer transistor 22. Since other circuit configurations are the same as those of FIG. 2, the description thereof will be omitted.

FIG. 8 is a diagram illustrating the operation timing of a selection signal PSEL, a reset signal PRES, and a transfer signal PTX and the potentials of the floating diffusions FD in the light receiving pixel and the reference pixel included in a particular row. Note that the index indicating the row number is omitted.

At the time T1, the selection signal PSEL becomes a high level, and the selection transistor 25 is turned on. At this time, the reset signal PRES is at a high level, and the reset transistor 23 is also in an on-state. At this time, each potential of the floating diffusions FD of the light receiving pixel and the reference pixel is a reset potential Vres. Then, the reset signal PRES becomes a low level, and the reset transistor 23 is turned off. At this time, the amplification transistor 24 outputs a signal (noise signal) having level in accordance with the reset potential Vres to the vertical output line 26.

At the time T2, the transfer signal PTX becomes a high level, and the transfer transistor 22 is turned on. At this time, in the light receiving pixel, charges accumulated in the photoelectric conversion element 21 are transferred to the floating diffusion FD. This causes the potential of the floating diffusion FD to change from the reset potential Vres to a signal potential Vsig. The amplification transistor 24 outputs, to the vertical output line 26, a pixel signal having a level in accordance with the signal potential Vsig.

In the first reference pixel supplied with the reference potential Va, once the transfer transistor 22 is turned on, the potential of the floating diffusion FD changes from the reset potential Vres to a potential V0 in accordance with the reference potential Va. The amplification transistor 24 outputs, to the vertical output line 26, a signal having a level in accordance with the potential V0. In the second reference pixel supplied with the reference potential Vb, once the transfer transistor 22 is turned on, the potential of the floating diffusion FD changes from the reset potential Vres to a potential V1 in accordance with the reference potential Vb. The amplification transistor 24 outputs, to the vertical output line 26, a signal having a level in accordance with the potential V1.

At the time T3, the reset signal PRES becomes a high level, and the reset transistor 23 is turned on. Subsequently, the selection signal PSEL becomes a low level, and the selection transistor 25 is turned off. Thereby, a readout operation of signals from a plurality of pixels included in a row is completed.

The output signals from the reference pixels P(k+1, 0) to P(m, n) will now be described in detail. As illustrated in FIG. 8, the output signal having a level corresponding to the potential V0 represents "0", and the output signal having a level corresponding to the potential V1 represents "1". In this example, the output signals of the reference pixels P from (k+1)-th column to the m-th column can be handled as digital values of (m-k) bits.

In the following description, in order to facilitate the understanding with a specific example, the reference pixels P(k+1, 0) to P(m, n) are of 16 rows by 4 columns as an example. However, the number of reference pixels is not limited thereto.

In this case, four reference pixels are included in a row. That is, each output signal from the reference pixels indicates a four-bit digital signal. Here, four-bit digital signal can express the values of 0 to 15, which can be associated with the row numbers. For example, the output signal of the reference pixel on the first row is represented as a signal value "0001", on the second row as "0010", on the third row as "0011", and so on, and in this way, a signal value representing the row number can be output in binary digits. In other words, the reference signals output from a plurality of reference pixels on each row are digital signals containing information on the rows to which those reference pixels belong. By referring to the digital signal, it is possible to determine whether or not a signal is normally output from a designated row. Thereby, failure detection of the imaging device can be performed at a higher accuracy.

Note that the drive method of the vertical scanning unit 13 that generates the reset signal PRES, the selection signal PSEL, and the transfer signal PTX in the present embodiment can be the same as that of the first embodiment or the second embodiment. Therefore, the same advantages as those in the first embodiment or the second embodiment can be obtained.

Fourth Embodiment

Figure 9:
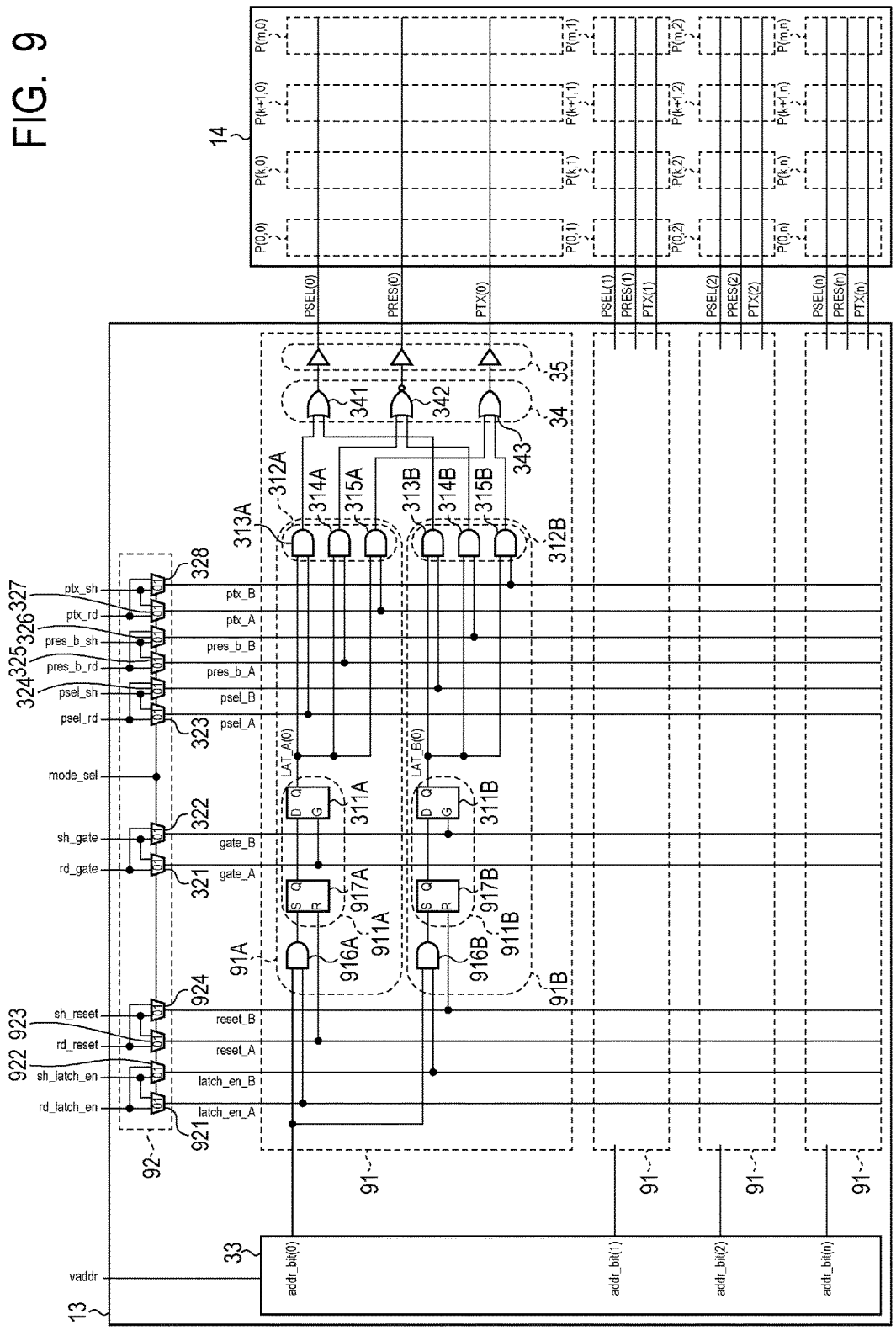
FIG. 9 is a block diagram of a vertical scanning unit and a pixel unit according to a fourth embodiment.

FIG. 9 is a block diagram illustrating an example configuration of the vertical scanning unit 13 and the pixel unit 14 according to the present embodiment. The vertical scanning unit 13 of the present embodiment is different from that of the first embodiment in the configuration of a row drive unit 91 and the configuration of a switching unit 92. While the configuration of the pixel unit 14 is the same as that described in the third embodiment in the example illustrated in FIG. 9, it may have the same configuration as the pixel unit 14 described in the first embodiment. The description of the same features as those in the above-described embodiments will be omitted or simplified.

While the configuration of the row drive unit 91 on the 0-th row will be mainly described below, the row drive units 91 on other rows have the same configuration. The row drive unit 91 has a signal generation unit 91A, a signal generation unit 91B, a signal combining unit 34, and a level shift unit 35. The signal generation unit 91A has an AND circuit 916A, a holding unit 911A, and the signal combining unit 312A. The signal generation unit 91B has an AND circuit 916B, a holding unit 911B, and the signal combining unit 312B. The holding unit 911A has an SR latch 917A and the D latch 311A. The holding unit 911B has an SR latch 917B and the D latch 311B.

The switching unit 92 has a plurality of selectors 321 to 328 and 921 to 924 that switch the control lines which output control signals used for readout scan and control signals used for shutter scan input from the control unit 12 in accordance with a mode selection signal mode_sel. The selectors 321 to 328 and the control signals corresponding thereto are the same as those in the first embodiment. In the present embodiment, in addition to the control signals described in the first embodiment, control signals rd_latch_en and rd_reset are input to the switching unit 92 as the control signal used for readout scan. Control signals sh_latch_en, and sh_reset are input to the switching unit 92 as the control signal used for shutter scan.

When the mode selection signal mode_sel is at a low level, the selector 921 selects the control signal rd_latch_en and outputs it as a control signal latch_en_A to one of the input terminals of the AND circuit 916A on each row. The selector 922 selects the control signal sh_latch_en and outputs it as a control signal latch_en B to one of the input terminals of the AND circuit 916B on each row. The selector 923 selects the control signal rd_reset and outputs it as a control signal reset_A to the reset terminal R of the SR latch 917A on each row. The selector 924 selects the control signal sh_reset and outputs it as a control signal reset_B to the reset terminal R of the SR latch 917B on each row.

When the mode selection signal mode_sel is at a high level, the selector 921 selects the control signal sh_latch_en and outputs it as a control signal latch_en_A to one of the input terminals of the AND circuit 916A on each row. The selector 922 selects the control signal rd_latch_en and outputs it as a control signal latch_en B to one of the input terminals of the AND circuit 916B on each row. The selector 923 selects the control signal sh_reset and outputs it as a control signal reset_A to the reset terminal R of the SR latch 917A on each row. The selector 924 selects the control signal rd_reset and outputs it as a control signal reset_B to the reset terminal R of the SR latch 917B on each row.

The control signal latch_en_A is input to one of the input terminals of the AND circuit 916A, and the decode signal addr_bit(0) is input to the other input terminal thereof. The AND circuit 916A outputs a logical product of these inputs to the set terminal S of the SR latch 917A. The output from the output terminal Q of the SR latch 917A is input to the data input terminal D of the D latch 311A. The control signal latch_en B is input to one of the input terminals of the AND circuit 916B, and the decode signal addr_bit(0) is input to the other input terminal thereof. The AND circuit 916B outputs a logical product of these inputs to the set terminal S of the SR latch 917B. The output from the output terminal Q of the SR latch 917B is input to the data input terminal D of the D latch 311B. Since the post-stage circuits of the D latch 311A and the D latch 311B are the same as those in the first embodiment, the description thereof will be omitted.

The holding portion 911A of the present embodiment has the SR latch 917A as a primary holding circuit (first holding unit) and the D latch 311A as a secondary holding circuit (second holding unit). In the present embodiment, with the two-stage holding circuit, a signal designating the row on which a drive signal is generated is held in the primary holding circuit, and a signal output from the first holding circuit is then held in the secondary holding circuit. That is, the decode signal held in the SR latch 917A on each row can be simultaneously set to (synchronized with) the D latch 311A by the control signal gate_A. The holding unit 911B has the same configuration and has the same function.

Figure 10:
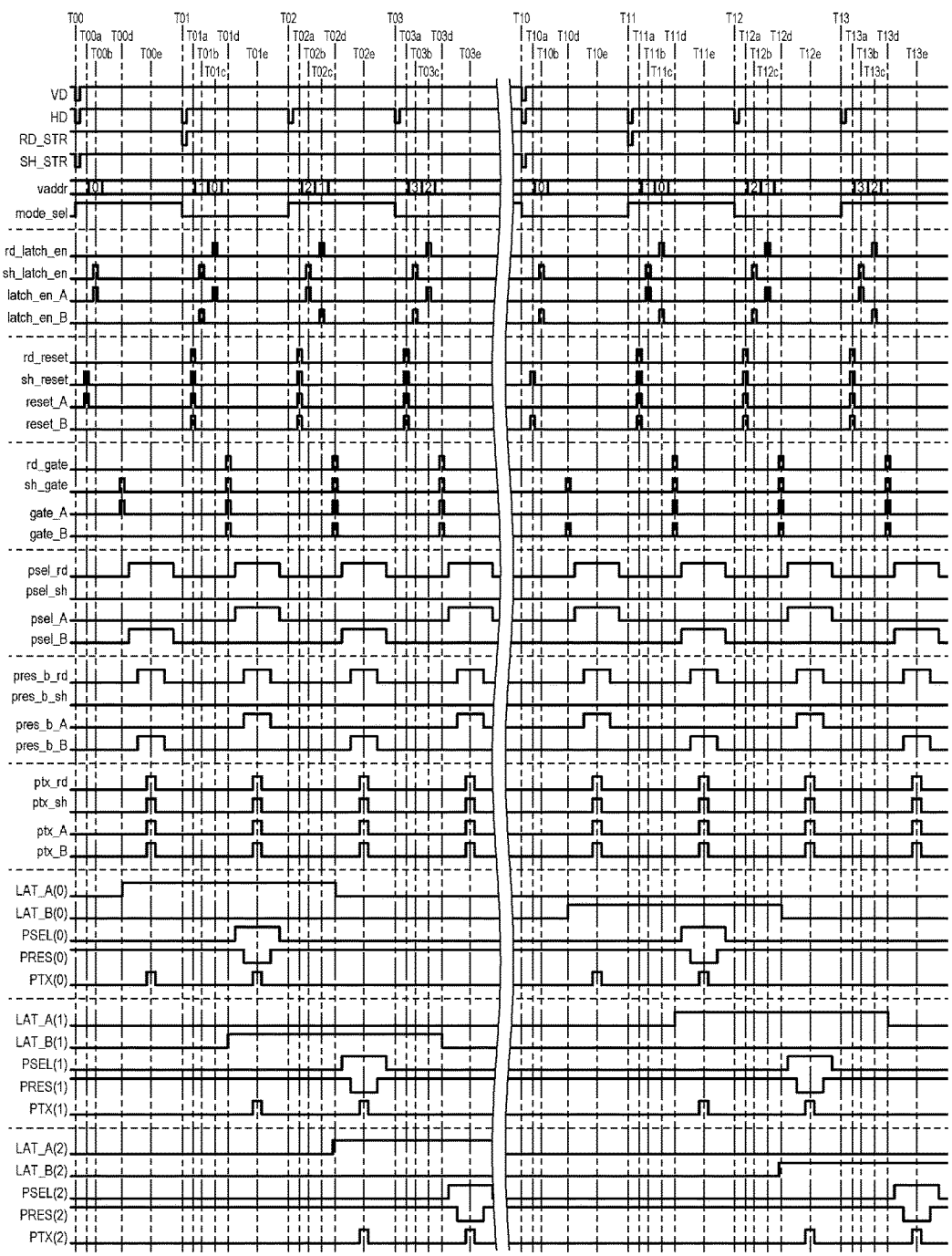
FIG. 10 is a timing chart illustrating a drive method of a vertical scanning unit according to the fourth embodiment.

FIG. 10 is a timing chart illustrating an example of the operation of the vertical scanning unit 13 and the pixel unit 14 according to the present embodiment. In the drive method of FIG. 10, in a similar manner to the second embodiment, the mode selection signal mode_sel is switched between a low level and a high level in an alternating manner every time a low-level pulse of the horizontal synchronization signal HD is input. Therefore, in the following, the features that are different from the second embodiment will be mainly described, and the description of the duplicated features will be omitted or simplified.

At the time T00, a shutter scan of the pixel unit is started. At the time T00, the CPU 11 inputs the vertical synchronization signal VD and the horizontal synchronization signal HD to the control unit 12. Further, at the same time, the shutter scan start signal SH_STR is input. Further, at the time T00, the mode selection signal mode_sel transitions to a high level. Before and after the time T00*a*, the control signal sh_reset is at a high level and is input as the control signal reset_A to the reset terminal R of the SR latch 917A on each row. Thereby, the SR latch 917A on each row is reset.

Before and after the time T00*b*, the control signal sh_latch_en is at a high level and is input as the control signal latch_en_A to one of the input terminals of the AND circuit 916A on each row. The AND circuit 916A on the 0-th row inputs a high-level signal, which is a logical product of the decode signal addr_bit(0) and the control signal latch_en_A, to the set terminal S of the SR latch 917A on the 0-th row. Thereby, a high level is set in the SR latch 917A on the 0-th row. Since the decode signal addr_bit(1) to addr_bit(n) are at a low level, a low level is set in the SR latches 917A from the first row to the n-th row.

Before and after the time T00*b*, the control signal sh_gate is at a high level and is input as the control signal gate_A to the gate input terminal G of the D latch 311A. Thereby, the D latch 311A on the 0-th row stores a high level output from the SR latch 917A and maintains the control signal LAT_A (0) at a high level. This is held until the time immediately before the time T02*d*. With the same operation, the control signals LAT_A(1) to LAT_A(n) are maintained at a low level during the period from the time T00*d* to the time T02*d*. In such a way, the signal held in the first holding circuit (SR latch 917A) is taken in the secondary holding circuit (D latch 311A). Since the operation in the post-stage of the D latch 311A at the time T00*e* is the same as that of the second embodiment, the description thereof is omitted.

At the time T01, a readout scan of the pixel unit is started. The CPU 11 inputs the horizontal synchronization signal HD and the readout scan start signal RD_STR to the control unit 12. Before and after the time T01*a*, the control signal rd_reset is at a high level and is input as the control signal reset_A to the reset terminal R of the SR latch 917A on each row. Thereby, the SR latch 917A on each row is reset. Further, at the same time, the control signal sh_reset is at a high level and is input as the control signal reset_B to the reset terminal R of the SR latch 917B on each row. Thereby, the SR latch 917B on each row is reset.

Before and after the time T01*b*, the control signal sh_latch_en is at a high level and is input as the control signal latch_en B to one of the input terminals of the AND circuit 916B on each row. The AND circuit 916B on the first row inputs a high-level signal, which is a logical product of the decode signal addr_bit(1) and the control signal latch_en B, to the set terminal S of the SR latch 917B on the first row. Thereby, a high level is set to the SR latch 917B on the first row. Since the decode signals addr_bit(0) and addr_bit(2) to addr_bit(n) are at a low level, a low level is set to the SR latches 917B from the 0-th row and the second row to the n-th row.

Before and after the time T01*c*, the control signal rd_latch_en is at a high level and is input as the control signal latch_en_A to one of the input terminals of the AND circuit 916A on each row. The AND circuit 916A on the 0-th row inputs a high-level signal, which is a logical product of the decode signal addr_bit(0) and the control signal latch_en_A, to the set terminal S of the SR latch 917A on the 0-th row. Thereby, a high level is set to the SR latch 917A on the 0-th row. Since the decode signals addr_bit(1) to addr_bit(n) are at a low level, a low level is set to the SR latches 917A from the first row to the n-th row.

Before and after the time T01*d*, the control signal rd_gate is at a high level and is input as the control signal gate_A to the gate input terminal G of the D latch 311A. Thereby, the D latch 311A on the 0-th row stores a high level output from the SR latch 917A and maintains the control signal LAT_A (0) to a high level. With the same operation, the control signals LAT_A(1) to LAT_A(n) are maintained at a low level. At the same time, the control signal sh_gate becomes a high level and is input as the control signal gate_B to the gate input terminal G of the D latch 311B. Thereby, the D latch 311B on the first row stores a high level output from the SR latch 917B and maintains the control signal LAT_B (1) to a high level. This is held until the time immediately before the time T03*d*. With the same operation, during a period from the time T01*d* to the time T03*d*, the control signals LAT_B(0) and LAT_B(2) to LAT_B(n) are maintained at a low level. In such a way, signals held in the primary holding circuit (SR latches 917A, 917B) are taken in the secondary holding circuit (D latches 311A, 311B).

Since the operation of the post-stage of the D latches 311A and 311B at the time T01e is the same as that of the second embodiment, the description thereof is omitted. Further, since the same operation is repeated after the time T2, the description thereof is omitted.

Also in the present embodiment, in a similar manner to the second embodiment, such an advantage is obtained that failure detection can be made for both a circuit that controls a readout scan and a circuit that controls an electronic shutter scan and that variation of the image quality within a frame is reduced.

Fifth Embodiment

Figure 11:
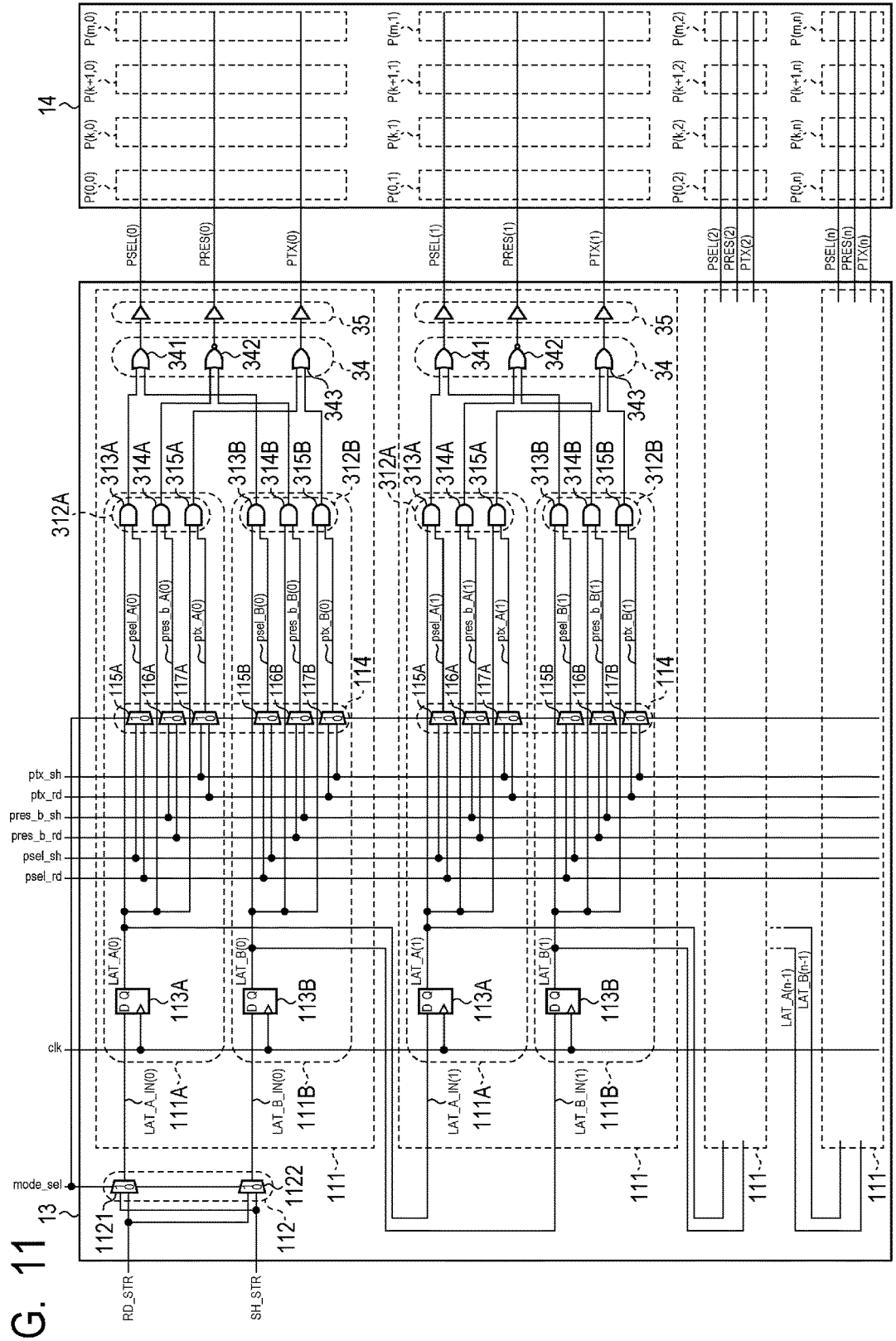
FIG. 11 is a block diagram of a vertical scanning unit and a pixel unit according to a fifth embodiment.

FIG. 11 is a block diagram illustrating an example configuration of the vertical scanning unit 13 and the pixel unit 14 according to the present embodiment. The vertical scanning unit 13 of the present embodiment is different from that of the first embodiment in that a shift resistor is used instead of the address decoder 33 of the above-described embodiment and that a plurality of switching unit are provided to be associated with respective rows. While the configuration of the pixel unit 14 is the same as that described in the third embodiment in the example illustrated in FIG. 11, it may have the same configuration as the pixel unit 14 described in the first embodiment. The description of the same features as those in the above-described embodiments will be omitted or simplified.

The vertical scanning unit 13 has row drive units 111 provided corresponding to respective rows of the pixel unit 14 and a switching unit 112. The switching unit 112 has selectors 1121 and 1122.

Each of the row drive units 111 has signal generation units 111A and 111B, the signal combining unit 34, the level shift unit 35, and a switching unit 114. The switching unit 114 has selectors 115A, 116A, and 117A that belong to the signal generation unit 111A and selectors 115B, 116B, and 117B that belong to the signal generation unit 111B.

The signal generation unit 111A has a D flip-flop 113A, the selectors 115A, 116A, and 117A, and the signal combining unit 312A. The signal generation unit 111B has a D flip-flop 113B, the selectors 115B, 116B, and 117B, and the signal combining unit 312B.

Each selector of the switching unit 112 outputs a signal input to the input terminal "0" of each selector when the mode selection signal mode_sel is at a low level and outputs a signal input to the input terminal "1" of each selector when the mode selection signal mode_sel is at a high level. Specifically, when the mode selection signal mode_sel is at a low level, the selector 1121 selects the readout scan start signal RD_STR and outputs it as a control signal LAT_A_IN(0) to the data input terminal D of the D flip-flop 113A on the 0-th row. The selector 1122 selects the shutter scan start signal SH_STR and outputs it as a control signal LAT_B_IN(0) to the data input terminal D of the D flip-flop 113B on the 0-th row.

On the other hand, when the mode selection signal mode_sel is at a high level, the selector 1121 selects the shutter scan start signal SH_STR and outputs it as a control signal LAT_A_IN(0) to the data input terminal D of the D flip-flop 113A on the 0-th row. The selector 1122 selects the readout scan start signal RD_STR and outputs it as a control signal LAT_B_IN(0) to the data input terminal D of the D flip-flop 113B on the 0-th row.

Each selector of the switching unit 114 outputs a signal input to the input terminal "0" of each selector when the mode selection signal mode_sel is at a low level. At this time, the switching unit 114 outputs a control signal used for readout scan to the signal combining unit 312A and outputs a control signal used for shutter scan to the signal combining unit 312B. This will be specifically described with respect to the row drive unit 111 on the 0-th row. When the mode selection signal mode_sel is at a low level, the selector 115A selects the control signal psel_rd and outputs it as the control signal psel_A(0) to one of the input terminals of the AND circuit 313A. The selector 116A selects the control signal pres_b_rd and outputs it as the control signal pres_b_A(0) to one of the input terminals of the AND circuit 314A. The selector 117A selects the control signal ptx_rd and outputs it as the control signal ptx_A(0) to one of the input terminals of the AND circuit 315A. The selector 115B selects the control signal psel_sh and outputs it as the control signal psel_B(0) to one of the input terminals of the AND circuit 313B. The selector 116B selects the control signal pres_b_sh and outputs it as the control signal pres_b_B(0) to one of the input terminals of the AND circuit 314B. The selector 117B selects the control signal ptx_sh and outputs it as the control signal ptx_B(0) to one of the input terminals of the AND circuit 315B.

On the other hand, each selector of the switching unit 114 outputs a signal input to the input terminal "1" of each selector when the mode selection signal mode_sel is at a high level. At this time, the switching unit 114 outputs a control signal used for shutter scan to the signal combining unit 312A and outputs a control signal used for readout scan to the signal combining unit 312B. The selector 115A selects the control signal psel_sh and outputs it as the control signal psel_A(0) to one of the input terminals of the AND circuit 313A. The selector 116A selects the control signal pres_b_sh and outputs it as the control signal pres_b_A(0) to one of the input terminals of the AND circuit 314A. The selector 117A selects the control signal ptx_sh and outputs it as the control signal ptx_A(0) to one of the input terminals of the AND circuit 315A. The selector 115B selects the control signal psel_rd and outputs it as the control signal psel_B(0) to one of the input terminals of the AND circuit 313B. The selector 116B selects the control signal pres_b_rd and outputs it as the control signal pres_b_B(0) to one of the input terminals of the AND circuit 314B. The selector 117B selects the control signal ptx_rd and outputs it as the control signal ptx_B(0) to one of the input terminals of the AND circuit 315B.

A clock signal clk is input to the clock input terminal of each of the D flip-flops 113A and 113B on each row. In response to a timing of a rising edge of the clock signal clk, the D flip-flop 113A on the 0-th row holds the control signal LAT_A_IN(0) and outputs it as the control signal LAT_A(0) from the output terminal Q. In response to a timing of a rising edge of the clock signal clk, the D flip-flop 113B on the 0-th row holds the control signal LAT_B_IN(0) and outputs it as the control signal LAT_B(0) from the output terminal Q.

The control signal LAT_A(0) is input to the other input terminal of each of the AND circuits 313A, 314A, and 315A. In addition, the control signal LAT_A(0) is input as the control signal LAT_A_IN(1) to the data input terminal D of the D flip-flop 113A on the first row. The control signal LAT_B(0) is input to the other input terminal of each of the AND circuits 313B, 314B, and 315B. In addition, the control signal LAT_B(0) is input as the control signal LAT_B_IN(1) to the data input terminal D of the D flip-flop 113B on the first row. The same applies to the subsequent rows. That is, the control signal LAT_A(r) on the r-th row (first row) is input as the control signal LAT_A_IN(r+1) to the data input terminal D of the D flip-flop 113A on the (r+1)-th row (second row) that is the next row. The same applies to the control signal LAT_B(r). In such a way, a shift resistor in which rows are sequentially driven in accordance with the clock signal clk is configured. Since the post-stage circuit of the signal combining units 312A and 312B is the same as that of the first embodiment, the description thereof will be omitted.

Figure 12:
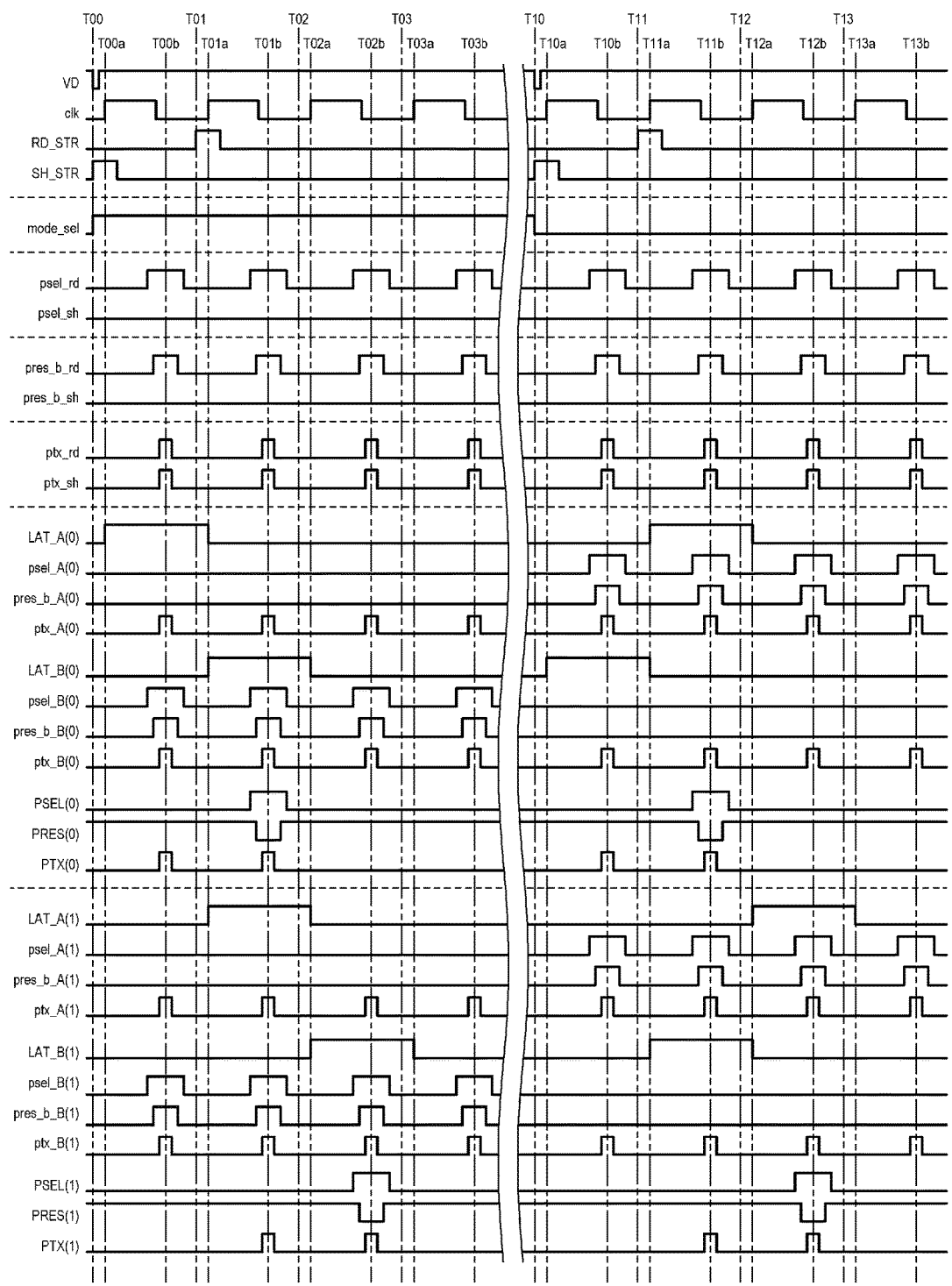
FIG. 12 is a timing chart illustrating a drive method of a vertical scanning unit according to the fifth embodiment.

FIG. 12 is a timing chart illustrating an example of the operation of the vertical scanning unit 13 and the pixel unit 14 according to the present embodiment. In the drive method of FIG. 12, in a similar manner to the first embodiment, the mode selection signal mode_sel is switched between a low level and a high level in an alternating manner every time a low-level pulse of the vertical synchronization signal VD is input. Therefore, in the following, the features that are different from the first embodiment will be mainly described, and the description of the duplicated features will be omitted or simplified.

At the time T00, a shutter scan of the pixel unit is started. At the time T00, the CPU 11 inputs the vertical synchronization signal VD to the control unit 12. At the same time, the shutter scan start signal SH_STR is input from the control unit 12 to the vertical scanning unit 13. Further, at the time T00, the mode selection signal mode_sel transitions to a high level.

At the time T00a, the CPU 11 inputs a high-level pulse of the clock signal clk to the control unit 12. The clock signal clk is input to the clock input terminals of the D flip-flops 113A and 113B on each column via the control unit 12. At the time T00a, the D flip-flop 113A on the 0-th row stores a high-level shutter scan start signal SH_STR input to the data input terminal D and maintains the control signal LAT_A(0) to the high level. This is maintained until the time T01a. During the same period, the control signals LAT_A(1) to LAT_A(n) from the first row to the n-th row are maintained at a low level. Therefore, the drive signal for driving a shutter scan is generated by only the signal generation unit 111A on the 0-th row.

Before and after the time T00b, the control signal ptx_sh is at a high level and input as the control signal ptx_A(0) from the selector 117A to one of the input terminals of the AND circuit 315A. The AND circuit 315A inputs a high-level signal, which is the logical product of the control signal LAT_A(0) and the control signal ptx_A(0), to the OR circuit 343. Thereby, the transfer signal PTX(0) becomes a high level in a similar manner to the first embodiment.

Next, at the time T01, a readout scan of the pixel unit 14 is started. The CPU 11 inputs the horizontal synchronization signal HD and the clock signal clk to the control unit 12. At the same time, the readout scan start signal RD_STR is input from the control unit 12 to the vertical scanning unit 13. At the time T01a, the D flip-flop 113B on the 0-th row stores the high-level readout scan start signal RD_STR input to the data input terminal D and maintains the control signal LAT_B(0) to the high level. This is maintained until the time T02a. Further, the D flip-flop 113A on the first row stores the high-level control signal LAT_A_IN(1) input to the data input terminal D and maintains the control signal LAT_A(1) to the high level. This is also maintained until the time T02a. During the same period, the drive signal for driving a shutter scan is generated from only the signal generation unit 111A on the first row, and the drive signal for driving a readout scan is generated from only the signal generation unit 111B on the 0-th row.

Before and after the time T01b, the control signal psel_rd is at a high level and input as the control signal psel_B(0) from the selector 115B to one of the input terminals of the AND circuit 313B. The AND circuit 315B on the 0-th row inputs a high-level signal, which is the logical product of the control signal LAT_B(0) and the control signal psel_B(0), to the OR circuit 341. Thereby, the selection signal PSEL(0) becomes a high level in a similar manner to the first embodiment.

Further, before and after the time T01b, the control signal pres_b_rd is at a high level and input as the control signal pres_b_B(0) to one of the input terminals of the AND circuit 314B on each row. The AND circuit 314B on the 0-th row inputs a high-level signal, which is the logical product of the control signal LAT_B(0) and the control signal pres_b_B(0), to the NOR circuit 342 on the 0-th row. Thereby, the reset signal PRES(0) becomes a low level in a similar manner to the first embodiment.

Further, before and after the time T01b, the control signal ptx_rd is at a high level and input as the control signal ptx_B(0) to one of the input terminals of the AND circuit 315B on each row. The AND circuit 315B on the 0-th row inputs a high-level signal, which is the logical product of the control signal LAT_B(0) and the control signal ptx_B(0), to the OR circuit 343 on the 0-th row. Thereby, the transfer signal PTX(0) becomes a high level in a similar manner to the first embodiment.

Further, before and after the time T01b, the control signal ptx_sh is at a high level and input as the control signal ptx_A(1) to one of the input terminals of the AND circuit 315A on each row. The AND circuit 315A on the first row inputs a high-level signal, which is the logical product of the control signal LAT_A(1) and the control signal ptx_A(1), to the OR circuit 343 on the first row. Thereby, the transfer signal PTX(1) becomes a high level in a similar manner to the first embodiment.

Subsequently, the shutter scan and the readout scan of the pixel unit 14 are performed by the same operation as above while the driven row is sequentially shifted downward, and then signals are read out from all the rows of the pixel unit 14. In such a way, in the scan starting from the time T00, the signal generation unit 111A generates a shutter scan signal for causing the photoelectric conversion elements 21 to be in a charge accumulation state, and the signal generation unit 111B generates a readout scan signal for reading out signals from pixels.

A scan starting from the time T10 is a scan of the frame next to the scan starting from the time T00 described above. In the scan starting from the time T10, the operation for the input signal to the vertical scanning unit 13 except the mode selection signal mode_sel and the output signal from the vertical scanning unit 13 is the same as the scan starting from the time T00 described above. The only difference is in that the functions of the signal generation unit 111A and the signal generation unit 111B are opposite to the above. In other words, in the scan starting from the time T10, the signal generation unit 111A generates a readout scan signal for reading out signals from pixels, and the signal generation unit 111B generates a shutter scan signal for causing the photoelectric conversion elements 21 to be in a charge accumulation state. Since other features are the same, the description thereof will be omitted.

Also in the present embodiment, in a similar manner to the first embodiment, failure detection can be made for both a circuit that controls a readout scan and a circuit that controls an electronic shutter scan. Further, in a similar manner to the first embodiment, with the switching between the first state and the second state being at the timing of switching frames, switching of the state is performed once per frame and thus is relatively less frequent, which allows for a reduction of power consumption due to the switching.

According to the first to fifth embodiments as described above, a solid state imaging device that can output the signal for failure detection for both a circuit that controls a readout scan and a circuit that controls a shutter scan can be provided.

Sixth Embodiment

Figure 13:
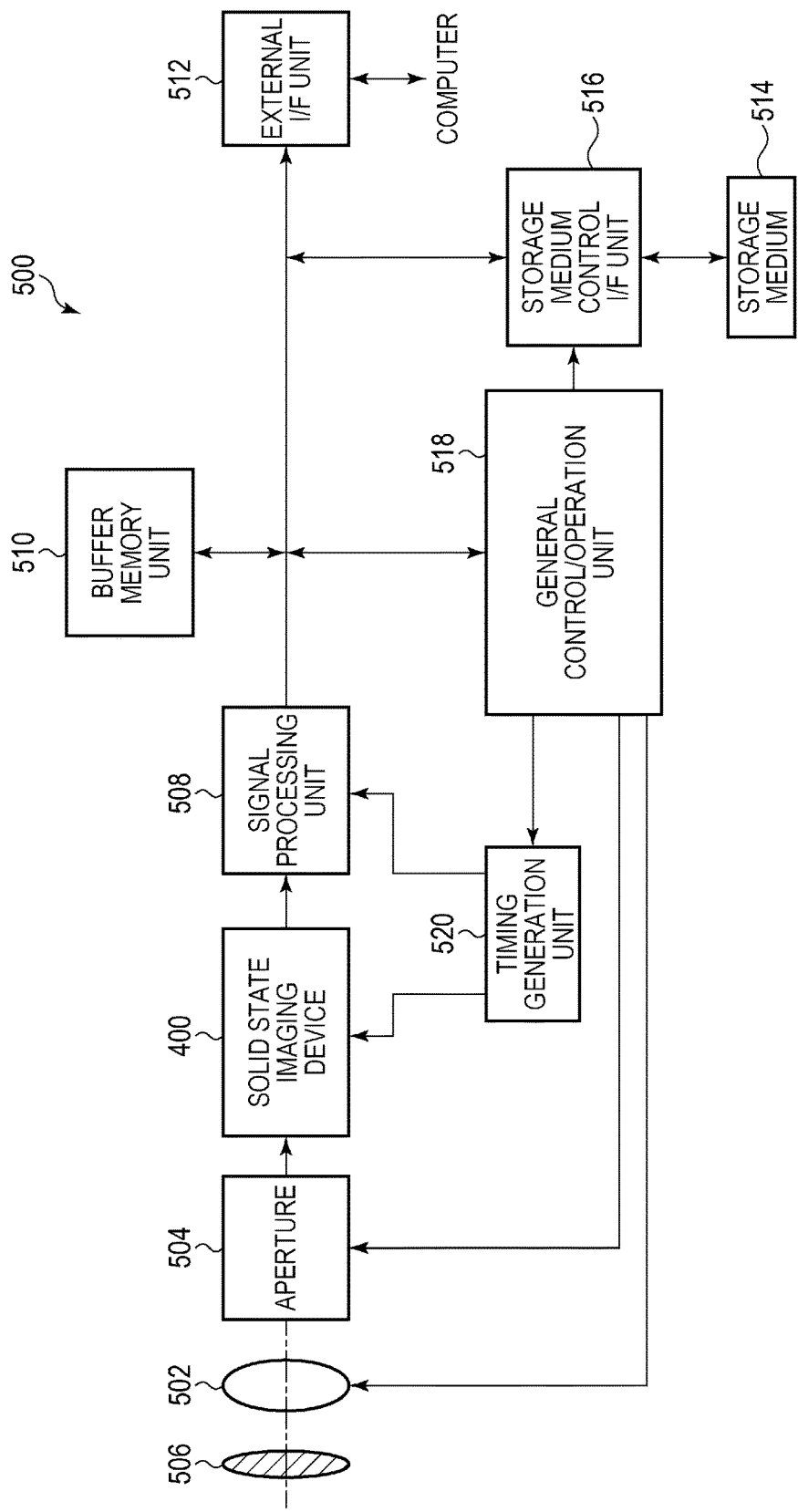
FIG. 13 is a block diagram of an imaging system according to a sixth embodiment.

Next, an example of an apparatus to which the solid state imaging device according to any of the above-described embodiments is applied will be described. FIG. 13 is a block diagram illustrating the configuration of an imaging system 500 according to the present embodiment. A solid state imaging device 400 illustrated in FIG. 13 is any of the solid state imaging devices described in the above first to fifth embodiments. The imaging system 500 to which the solid state imaging device 400 can be applied may be, for example, a digital still camera, a digital camcorder, a surveillance camera, or the like. FIG. 13 illustrates an example configuration of a digital still camera to which the solid state imaging device 400 of any of the above-described embodiments is applied.

The imaging system 500 illustrated in FIG. 13 has the solid state imaging device 400, a lens 502 that causes an optical image of a subject to be captured onto the solid state imaging device 400, an aperture 504 for changing the amount of a light passing through the lens 502, and a barrier 506 for protecting the lens 502. The lens 502 and the aperture 504 form an optical system that converges a light onto the solid state imaging device 400.

The imaging system 500 further has a signal processing unit 508 that performs processing of an output signal output from the solid state imaging device 400. The signal processing unit 508 performs signal processing operations of performing, if necessary, various correction and compression on an input signal for output. The signal processing unit 508 may have a function of performing AD conversion process on an output signal output from the solid state imaging device 400. In this case, the AD converter circuit is not necessarily required to be provided inside the solid state imaging device 400.

The imaging system 500 further has a buffer memory unit 510 for temporarily storing image data and an external interface unit (external I/F unit) 512 for communicating with an external computer or the like. Furthermore, the imaging system 500 has a storage medium 514 such as a semiconductor memory or the like for performing recording or readout of captured data and a storage medium control interface unit (storage medium control I/F unit) 516 for performing recording to or readout from the storage medium 514. Note that the storage medium 514 may be embedded in the imaging system 500 or may be removable.

Furthermore, the imaging system 500 has a general control/operation unit 518 that performs various operation and controls the entire digital still camera and a timing generation unit 520 that outputs various timing signals to the solid state imaging device 400 and the signal processing unit 508. Here, the timing signal or the like may be supplied from the outside, and the imaging system 500 may be any imaging system as long as it has at least the solid state imaging device 400 and the signal processing unit 508 that processes an output signal output from the solid state imaging device 400. The general control/operation unit 518 and the timing generation unit 520 may be configured to perform some or all of the functions of the CPU 11, the control unit 12, or the like of the embodiments described above.

The solid state imaging device 400 outputs a signal used for an image to the signal processing unit 508. The signal processing unit 508 performs predetermined signal processing on the signal used for an image output from the solid state imaging device 400 to output image data. Further, the signal processing unit 508 uses the signal used for an image to generate an image.

By forming an imaging system using the solid state imaging device 400 according to the first to fifth embodiments, an imaging system that can perform failure detection in a more reliable manner can be realized.

Seventh Embodiment

Figure 14A:
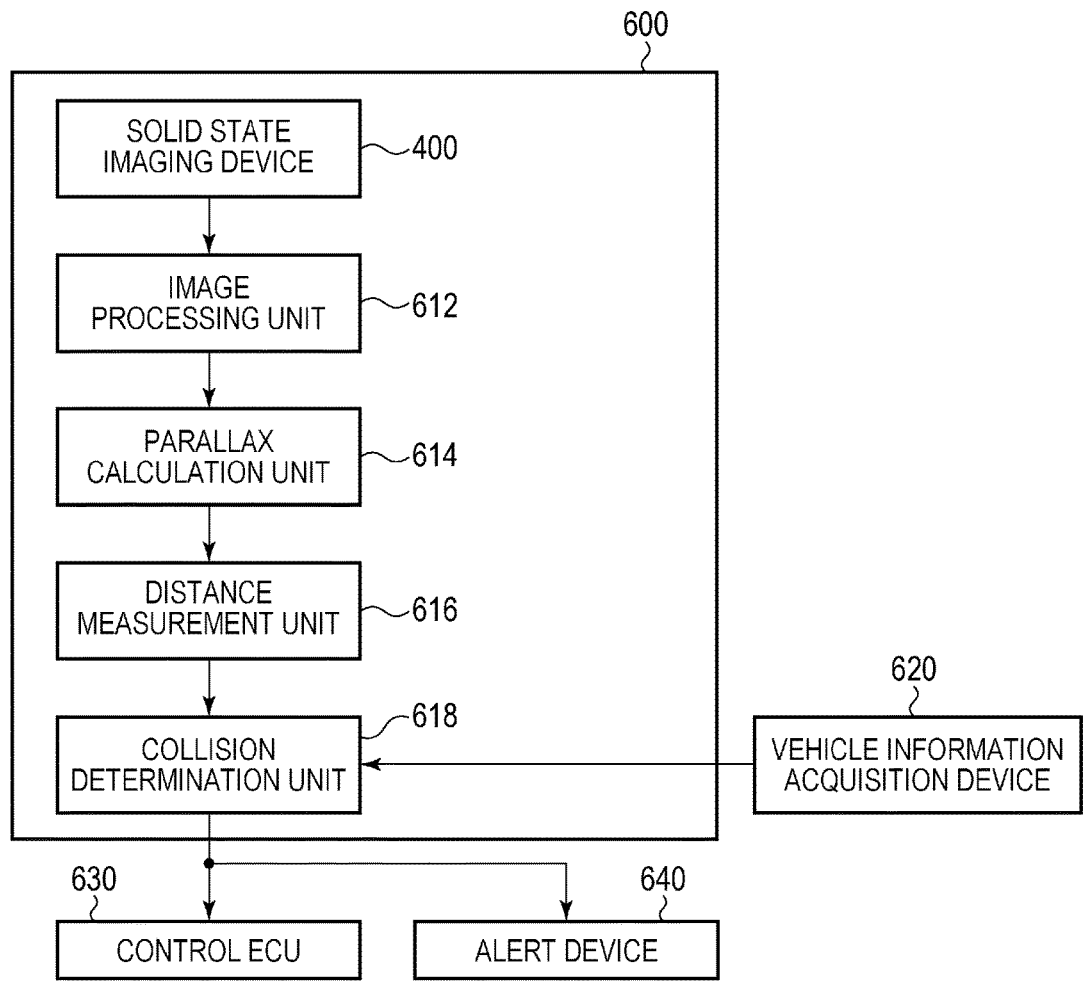
FIG. 14A and FIG. 14B are block diagrams of an imaging system and a mobile apparatus according to a seventh embodiment.
Figure 14B:
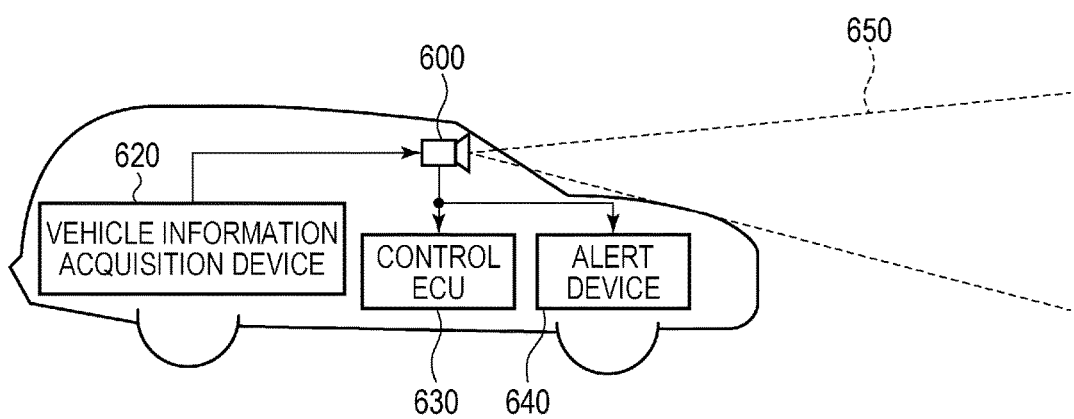

FIG. 14A and FIG. 14B are diagrams illustrating the configuration of an imaging system 600 and a mobile apparatus according to the present embodiment. FIG. 14A illustrates an example of the imaging system 600 for an on-vehicle camera. The imaging system 600 has the solid state imaging device 400. The solid state imaging device 400 is any of the solid state imaging devices 400 described in the above first to fifth embodiments. The imaging system 600 has an image processing unit 612 that performs image processing on a plurality of image data acquired by the solid state imaging device 400 and a parallax calculation unit 614 that calculates a parallax (a phase difference of parallax images) from the plurality of image data acquired by the imaging system 600. Further, the imaging system 600 has a distance measurement unit 616 that calculates a distance to the object based on the calculated parallax and a collision determination unit 618 that determines whether or not there is a collision possibility based on the calculated distance. Here, the parallax calculation unit 614 and the distance measurement unit 616 are an example of a distance information acquisition unit that acquires distance information on the distance to the object. That is, the distance information is information regarding a parallax, a defocus amount, a distance to an object, or the like. The collision determination unit 618 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like, or may be implemented by combination thereof.

The imaging system 600 is connected to the vehicle information acquisition device 620 and can acquire vehicle information such as a vehicle speed, a yaw rate, a steering angle, or the like. Further, the imaging system 600 is connected with a control ECU 630, which is a control device that outputs a control signal for causing a vehicle to generate braking force based on a determination result by the collision determination unit 618. That is, the control ECU 630 is an example of a mobile apparatus control unit that controls a mobile apparatus based on distance information. Further, the imaging system 600 is connected with an alert device 640 that issues an alert to the driver based on a determination result by the collision determination unit 618. For example, when the collision probability is high as the determination result of the collision determination unit 618, the control ECU 630 performs vehicle control to avoid a collision or reduce damage by applying a brake, pushing back an accelerator, suppressing engine power, or the like. The alert device 640 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 600. FIG. 14B illustrates the imaging system 600 in a case of capturing a front area of a vehicle (a capturing area 650). The vehicle information acquisition device 620 transmits instructions to operate the imaging system 600 and perform capturing of an image. With a use of the solid state imaging device 400 according to the first to fifth embodiments, the imaging system 600 of the present embodiment can perform failure detection in a more reliable manner.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a mobile apparatus (moving apparatus) such as a ship, an airplane, or an industrial robot, for example. In addition, the imaging system can be widely applied to a device which utilizes object recognition, such as an intelligent transportation system (ITS), without being limited to mobile apparatuses.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, it should be appreciated that an embodiment in which a part of the configuration of any of the embodiments is added to another embodiment or an embodiment in which a part of the configuration of any of the embodiments is replaced with a part of the configuration of another embodiment is the embodiment to which the present invention can be applied.

This application claims the benefit of Japanese Patent Application No. 2017-031170, filed Feb. 22, 2017, which is hereby incorporated by reference herein in its entirety.

What is claimed is:

1. A solid state imaging device comprising:
   a pixel unit including a plurality of pixels arranged to form a plurality of rows, each of the plurality of pixels including a photoelectric conversion element;
   a plurality of row drive circuits respectively corresponding to the plurality of rows of the pixel unit, each including
      a first signal generation unit,
      a second signal generation unit, and
      a drive signal generation unit configured to generate a readout scan signal for reading out a signal from the pixels and a shutter scan signal for causing the photoelectric conversion element to start charge accumulation, as drive signals for driving the plurality of pixels, based on a signal output from the first signal generation unit and a signal output from corresponding one of the second signal generation unit; and
   a switching unit configured to switch the row drive circuit between:
      a first state in which the first signal generation unit generates the readout scan signal and the second signal generation unit generates the shutter scan signal and
      a second state in which the first signal generation unit generates the shutter scan signal and the second signal generation unit generates the readout scan signal.

2. The solid state imaging device according to claim 1,
   wherein the pixel unit further includes a plurality of reference pixels arranged so as to belong to the plurality of rows, and each of the reference pixels outputs a reference signal, and
   wherein the reference signals output from multiple reference pixels arranged on the same row indicate information on a row to which the multiple reference pixels belong.

3. The solid state imaging device according to claim 1, wherein the switching unit performs switching between the first state and the second state by switching a signal provided in common to the first signal generation units in the plurality of row drive circuits and a signal provided in common to the second signal generation units in the plurality of row drive circuits.

4. The solid state imaging device according to claim 1,
   wherein the switching unit includes a plurality of row switching units which are provided correspondingly to the plurality of rows of the pixel unit, and
   wherein each of the row switching units performs switching between the first state and the second state by switching signals provided to the first signal generation unit and the second signal generation units in a corresponding one of the plurality of row drive circuits.

5. The solid state imaging device according to claim 1,
   wherein each of the first signal generation units and the second signal generation units comprises a holding unit configured to hold a signal that designates a row on which the drive signal is generated, and wherein the readout scan signal or the shutter scan signal is generated in accordance with a signal output from or held by the holding unit.

6. The solid state imaging device according to claim 5 further comprising a row designation unit configured to output, to the holding unit on each row, a signal that designates a row on which the drive signal is generated.

7. The solid state imaging device according to claim 5, wherein the holding unit includes a first holding unit and a second holding unit, and
the signal that designates a row on which the drive signal is generated is held in the first holding unit, and then, a signal output from the first holding unit is held in the second holding unit.

8. The solid state imaging device according to claim 5, wherein an output signal from the holding unit corresponding to a first row is input to the holding unit corresponding to a second row different from the first row.

9. The solid state imaging device according to claim 1, wherein the switching unit performs switching between the first state and the second state at a timing when a vertical synchronization signal that synchronizes with a frame period is input.

10. The solid state imaging device according to claim 1, wherein the switching unit performs switching between the first state and the second state at a timing when a horizontal synchronization signal that synchronizes with readout on each row is input.

11. The solid state imaging device according to claim 1, wherein the pixel unit includes a light-shield pixel in which the photoelectric conversion element is shielded from a light.

12. An imaging system comprising:
the solid state imaging device according to claim 1; and
a signal processing unit configured to process a signal output from the solid state imaging device.

13. A mobile apparatus comprising:
the solid state imaging device according to claim 1;
a distance information acquisition unit configured to acquire distance information on a distance to an object, from parallax images based on a signal from the solid state imaging device; and
a mobile apparatus control unit configured to control the mobile apparatus based on the distance information.

14. A control method of a solid state imaging device comprising
a pixel unit including a plurality of pixels arranged to form a plurality of rows, each of the plurality of pixels including a photoelectric conversion element, and
a plurality of row drive circuits respectively corresponding to the plurality of rows of the pixel unit, each including
a first signal generation unit,
a second signal generation unit, and
a drive signal generation unit configured to generate a readout scan signal for reading out a signal from the pixels and a shutter scan signal for causing the photoelectric conversion element to start charge accumulation, as drive signals for driving the plurality of pixels, based on a signal output from the first signal generation unit and a signal output from corresponding one of the second signal generation unit,
the control method comprising steps of:
generating the readout scan signal at the first signal generation unit and generating the shutter scan signal at the second signal generation unit; and
generating the shutter scan signal at the first signal generation unit and generating the readout scan signal at the second signal generation unit.

* * * * *